United States Patent
Yu et al.

(10) Patent No.: US 11,211,371 B2
(45) Date of Patent: Dec. 28, 2021

(54) INTEGRATED CIRCUIT PACKAGE AND METHOD

(71) Applicant: Taiwan Semiconductor Manufacturing Co., Ltd., Hsinchu (TW)

(72) Inventors: Chen-Hua Yu, Hsinchu (TW); Wei Ling Chang, Hsinchu (TW); Chuei-Tang Wang, Taichung (TW); Chieh-Yen Chen, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/882,191

(22) Filed: May 22, 2020

(65) Prior Publication Data

US 2021/0118859 A1  Apr. 22, 2021

Related U.S. Application Data

(60) Provisional application No. 62/923,131, filed on Oct. 18, 2019.

(51) Int. Cl.
| | |
|---|---|
| *H01L 23/495* | (2006.01) |
| *H01L 25/18* | (2006.01) |
| *H01L 23/498* | (2006.01) |
| *H01L 23/48* | (2006.01) |
| *H01L 25/16* | (2006.01) |
| *H01L 23/31* | (2006.01) |
| *H01L 25/00* | (2006.01) |
| *H01L 23/00* | (2006.01) |

(Continued)

(52) U.S. Cl.
CPC ............ *H01L 25/18* (2013.01); *H01L 21/486* (2013.01); *H01L 21/4857* (2013.01);
(Continued)

(58) Field of Classification Search
CPC ..... H01L 21/56; H01L 21/78; H01L 21/4857; H01L 21/486; H01L 23/49838;
(Continued)

(56) References Cited

U.S. PATENT DOCUMENTS

| | | | |
|---|---|---|---|
| 8,138,014 B2 * | 3/2012 | Chi | ..................... H01L 25/0657 438/106 |
| 8,361,842 B2 | 1/2013 | Yu et al. | |

(Continued)

FOREIGN PATENT DOCUMENTS

| | | |
|---|---|---|
| CN | 105304617 A | 2/2016 |
| KR | 20150125582 A | 11/2015 |

(Continued)

*Primary Examiner* — Luan C Thai
(74) *Attorney, Agent, or Firm* — Slater Matsil, LLP

(57) ABSTRACT

In an embodiment, a structure includes: a graphics processor device; a passive device coupled to the graphics processor device, the passive device being directly face-to-face bonded to the graphics processor device; a shared memory device coupled to the graphics processor device, the shared memory device being directly face-to-face bonded to the graphics processor device; a central processor device coupled to the shared memory device, the central processor device being directly back-to-back bonded to the shared memory device, the central processor device and the graphics processor device each having active devices of a smaller technology node than the shared memory device; and a redistribution structure coupled to the central processor device, the shared memory device, the passive device, and the graphics processor device.

20 Claims, 28 Drawing Sheets

(51) Int. Cl.
*H01L 21/78* (2006.01)
*H01L 21/56* (2006.01)
*H01L 21/48* (2006.01)

(52) U.S. Cl.
CPC .............. *H01L 21/56* (2013.01); *H01L 21/78*
(2013.01); *H01L 23/3128* (2013.01); *H01L
23/481* (2013.01); *H01L 23/49816* (2013.01);
*H01L 23/49822* (2013.01); *H01L 23/49838*
(2013.01); *H01L 24/19* (2013.01); *H01L 24/24*
(2013.01); *H01L 24/25* (2013.01); *H01L 25/16*
(2013.01); *H01L 25/50* (2013.01); *H01L
2224/24145* (2013.01); *H01L 2224/24225*
(2013.01); *H01L 2224/2518* (2013.01); *H01L
2924/1432* (2013.01); *H01L 2924/1434*
(2013.01)

(58) Field of Classification Search
CPC ............. H01L 23/481; H01L 23/49822; H01L
23/49816; H01L 23/3128; H01L 24/19;
H01L 24/24; H01L 24/25; H01L 25/18;
H01L 25/16; H01L 25/50
USPC ........................................................ 257/668
See application file for complete search history.

(56) References Cited

U.S. PATENT DOCUMENTS

| | | | |
|---|---|---|---|
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,219,023 B2 * | 12/2015 | Farooq | H01L 29/0657 |
| 9,666,520 B2 | 5/2017 | Yu et al. | |
| 9,899,355 B2 | 2/2018 | Yuan et al. | |
| 10,290,571 B2 | 5/2019 | Yu et al. | |
| 10,685,911 B2 | 6/2020 | Chen et al. | |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2019/0115277 A1 | 4/2019 | Yu et al. | |
| 2019/0148336 A1 | 5/2019 | Chen et al. | |
| 2019/0385977 A1 * | 12/2019 | Elsherbini | H01L 25/50 |

FOREIGN PATENT DOCUMENTS

| | | |
|---|---|---|
| TW | 201712836 A | 4/2017 |
| TW | 201813008 A | 4/2018 |
| TW | 201901817 A | 1/2019 |
| TW | 201916191 A | 4/2019 |

* cited by examiner

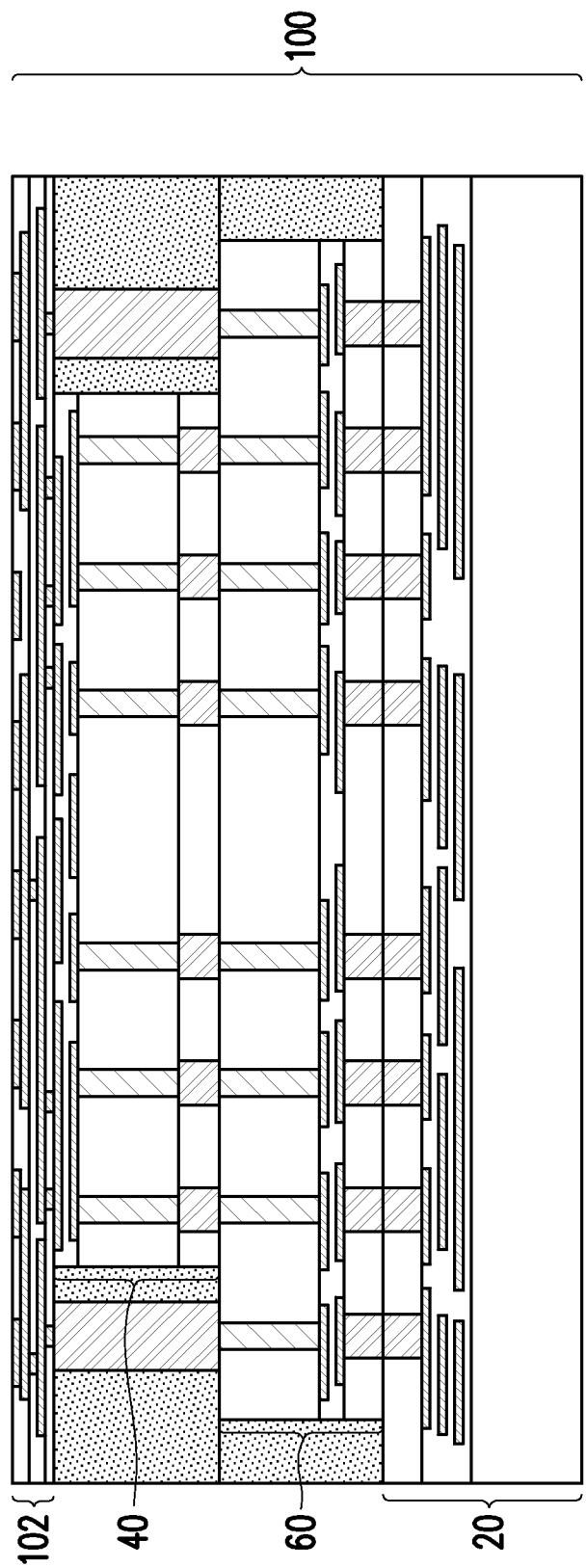

INTEGRATED CIRCUIT PACKAGE AND METHOD

PRIORITY CLAIM AND CROSS-REFERENCE

This application claims the benefit of U.S. Provisional Application No. 62/923,131, filed on Oct. 18, 2019, which application is hereby incorporated herein by reference.

BACKGROUND

As semiconductor technologies continue to evolve, integrated circuit dies are becoming increasingly smaller. Further, more functions are being integrated into the dies. Accordingly, the numbers of input/output (I/O) pads needed by dies has increased while the area available for the I/O pads has decreased. The density of the I/O pads has risen quickly over time, increasing the difficulty of die packaging. Some applications call for greater parallel processing capabilities of integrated circuit dies. Packaging technologies may be used to integrate of multiple dies, allowing a greater degree of parallel processing capabilities.

In some packaging technologies, integrated circuit dies are singulated from wafers before they are packaged. An advantageous feature of this packaging technology is the possibility of forming fan-out packages, which allow the I/O pads on a die to be redistributed to a greater area. The number of I/O pads on the surfaces of the dies may thus be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B, 4A, 4B, 5A, 5B, 6A, 6B, 7A, 7B, 8A, and 8B are cross-sectional views of intermediate steps during a process for forming an integrated circuit package, in accordance with some embodiments.

DETAILED DESCRIPTION

Figure 1A:
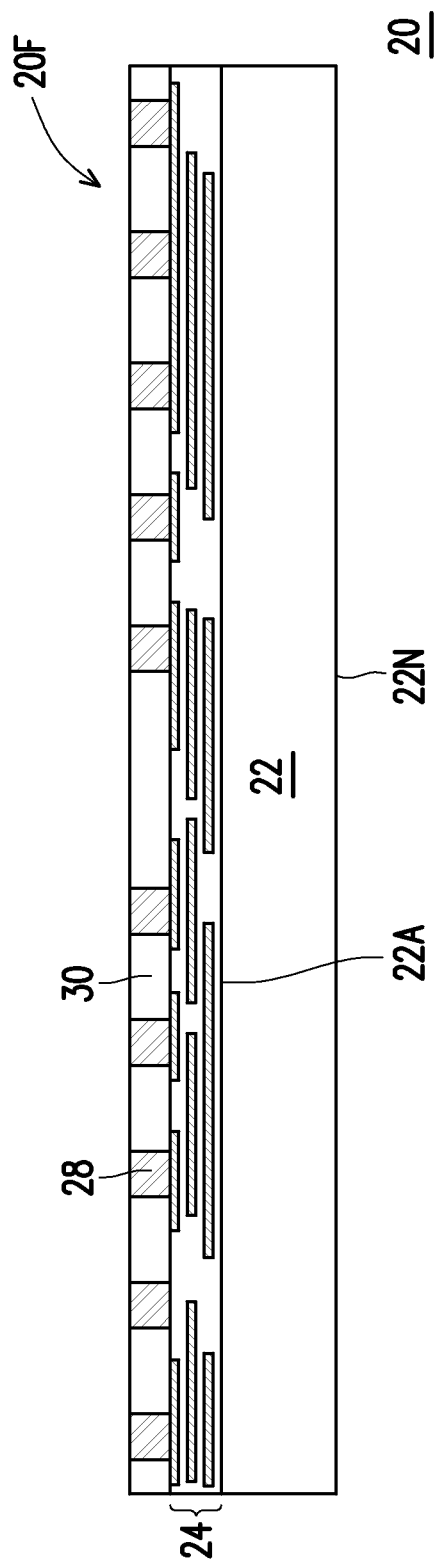
FIGS. 1A, 1B, 1C, and 1D are cross-sectional views of semiconductor devices, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit package includes a memory device sandwiched between two different types of processor devices, such as a graphics processing unit and a central processing unit. The memory device is shared by both processor devices during operation. The semiconductor devices are bonded by hybrid bonding. As described further below, data signalling among the semiconductor devices of the integrated circuit package can be accomplished by direct connections over the hybrid bonds, instead of by data signal lines of a redistribution structure. Although the integrated circuit package can be formed with a redistribution structure, interconnecting the dies by hybrid bonding allows the quantity of data signal lines in the redistribution structure to be reduced.

FIGS. 1A through 1D are a cross-sectional view of semiconductor devices, in accordance with some embodiments. Specifically, FIGS. 1A, 1B, 1C, and 1D, respectively, illustrate a first processor device 20, a second processor device 40, a memory device 60, and a passive device 80. The semiconductor devices will be packaged in subsequent processing to form an integrated circuit package, such as a system-on-integrated-chip (SoIC) device. Each semiconductor device can be a bare integrated circuit die or a packaged die. In the embodiment illustrated, each semiconductor device is a bare integrated circuit die. In other embodiments, one or more of the illustrated semiconductor devices can be packaged dies that are encapsulated.

Referring to FIG. 1A, the first processor device 20 can be any acceptable processor or logic device, such as graphics processing unit (GPU), a central processing unit (CPU), system-on-a-chip (SoC), application processor (AP), digital signal processing (DSP), field programmable gate array (FPGA), microcontroller, artificial intelligence (AI) accelerator, or the like. The first processor device 20 may be processed according to applicable manufacturing processes to form integrated circuits. For example, the first processor device 20 includes a semiconductor substrate 22, such as silicon, doped or undoped, or an active layer of a semiconductor-on-insulator (SOI) substrate. The semiconductor substrate 22 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 22 has an active surface 22A and an inactive surface 22N.

Devices may be formed at the active surface 22A of the semiconductor substrate 22. The devices may be active devices (e.g., transistors, diodes, etc.), capacitors, resistors, etc. The inactive surface 22N may be free from devices. An inter-layer dielectric (ILD) is over the active surface 22A of the semiconductor substrate 22. The ILD surrounds and may cover the devices. The ILD may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

An interconnect structure 24 is over the active surface 22A of the semiconductor substrate 22. The interconnect structure 24 interconnects the devices at the active surface 22A of the semiconductor substrate 22 to form an integrated circuit. The interconnect structure 24 may be formed by, for example, metallization patterns in dielectric layers. The metallization patterns include metal lines and vias formed in one or more dielectric layers. The metallization patterns of the interconnect structure 24 are electrically connected to the devices at the active surface 22A of the semiconductor substrate 22.

Die connectors 28 are at a front side 20F of the first processor device 20. The die connectors 28 may be conductive pillars, pads, or the like, to which external connections are made. The die connectors 28 are in and/or on the interconnect structure 24, and can be formed of a metal, such as copper, aluminum, or the like. The die connectors 28 may be formed by, for example, plating, or the like.

A dielectric layer 30 is at the front side 20F the first processor device 20, such as on the interconnect structure 24. The dielectric layer 30 laterally encapsulates the die connectors 28, and the dielectric layer 30 is laterally coterminous with sidewalls of the first processor device 20. Initially, the dielectric layer 30 may bury the die connectors 28, such that the topmost surface of the dielectric layer 30 is above the topmost surfaces of the die connectors 28. The dielectric layer 30 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 30 may be formed, for example, by spin coating, lamination, chemical vapor deposition (CVD), or the like. After formation, the die connectors 28 and dielectric layer 30 can be planarized using, e.g., a chemical-mechanical polish (CMP) process, an etch back process, the like, or combinations thereof. After planarization, surfaces of the die connectors 28 and dielectric layer 30 are planar and are exposed at the front side 20F of the first processor device 20.

Figure 1B:
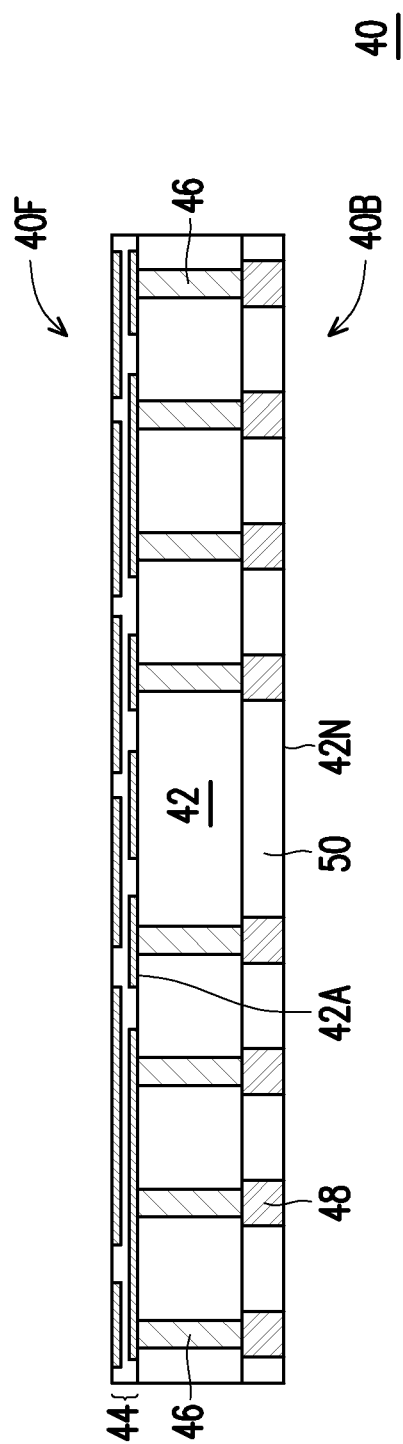

Referring to FIG. 1B, the second processor device 40 can be any acceptable processor or logic device, such as a central processing unit (CPU), graphics processing unit (GPU), system-on-a-chip (SoC), application processor (AP), digital signal processing (DSP), field programmable gate array (FPGA), microcontroller, artificial intelligence (AI) accelerator, or the like. The second processor device 40 may be processed according to applicable manufacturing processes to form integrated circuits. For example, the second processor device 40 includes a semiconductor substrate 42, which has an active surface 42A and an inactive surface 42N. The semiconductor substrate 42 can be similar to the semiconductor substrate 22. The second processor device 40 also includes an interconnect structure 44 at a front side 40F of the second processor device 40. The interconnect structure 44 can be similar to the interconnect structure 24. The second processor device 40 further includes conductive vias 46, which are formed extending between the active surface 42A and inactive surface 42N of the semiconductor substrate 42. The conductive vias 46 are also sometimes referred to as through-substrate vias or through-silicon vias (TSVs). The conductive vias 46 are physically and electrically connected to the metallization patterns of the interconnect structure 44.

As an example to form the conductive vias 46, recesses can be formed in the semiconductor substrate 42 by, for example, etching, milling, laser techniques, a combination thereof, and/or the like. A thin dielectric material may be formed in the recesses, such as by using an oxidation technique. A thin barrier layer may be conformally deposited over active surface 42A of the semiconductor substrate 42 and in the openings, such as by CVD, atomic layer deposition (ALD), physical vapor deposition (PVD), thermal oxidation, a combination thereof, and/or the like. The barrier layer may be formed from an oxide, a nitride, or an oxynitride, such as titanium nitride, titanium oxynitride, tantalum nitride, tantalum oxynitride, tungsten nitride, a combination thereof, and/or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the active surface 42A of the semiconductor substrate 42 by, for example, a CMP. Remaining portions of the barrier layer and conductive material form the conductive vias 46.

Die connectors 48 and a dielectric layer 50 are formed on the inactive surface 42N of the semiconductor substrate 42. The die connectors 48 may be formed of a similar material and by a similar method as the die connectors 28. The die connectors 48 are physically connected to the conductive vias 46, and are electrically connected to integrated circuits of the second processor device 40 by the conductive vias 46. The dielectric layer 50 may be formed of a similar material and by a similar method as the dielectric layer 30. Before forming the die connectors 48 and dielectric layer 50, the inactive surface 42N of the semiconductor substrate 42 can be ground to expose the conductive vias 46. After formation, the die connectors 48 and dielectric layer 50 can be planarized using, e.g., a CMP process, an etch back process, the like, or combinations thereof. After planarization, surfaces of the die connectors 48 and dielectric layer 50 are planar and are exposed at the back side 40B of the second processor device 40.

Figure 1C:
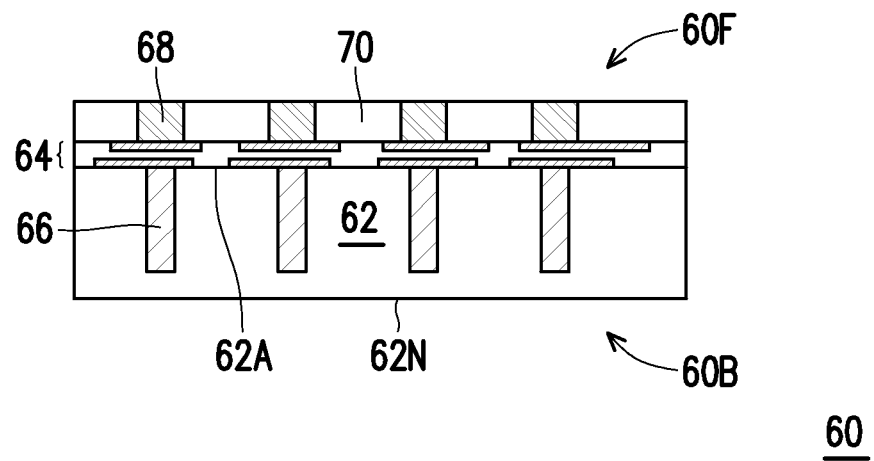

Referring to FIG. 1C, the memory device 60 can be any acceptable memory device, such as a dynamic random access memory (DRAM) device, static random access memory (SRAM) device, resistive random-access memory (RRAM) device, magnetoresistive random-access memory (MRAM) device, phase-change random-access memory (PCRAM) device, or the like. The memory device 60 may be processed according to applicable manufacturing processes to form integrated circuits. For example, the memory device 60 includes a semiconductor substrate 62, which has an active surface 62A and an inactive surface 62N. The semiconductor substrate 62 can be similar to the semiconductor substrate 22. The memory device 60 also includes an interconnect structure 64, die connectors 68, and a dielectric layer 70 which, respectively, can be similar to the interconnect structure 24, conductive vias 46, die connectors 28, and dielectric layer 30. The die connectors 68 and dielectric layer 70 are exposed at a front side 60F of the memory device 60.

The memory device 60 further includes conductive vias 66. In the embodiment illustrated, the conductive vias 66 are not yet exposed at a back side 60B of the memory device 60. Rather, the conductive vias 66 are buried in the semiconductor substrate 62. As discussed further below, the conductive vias 66 will be exposed at the back side 60B of the memory device 60 through a planarization process in subsequent processing.

Figure 1D:
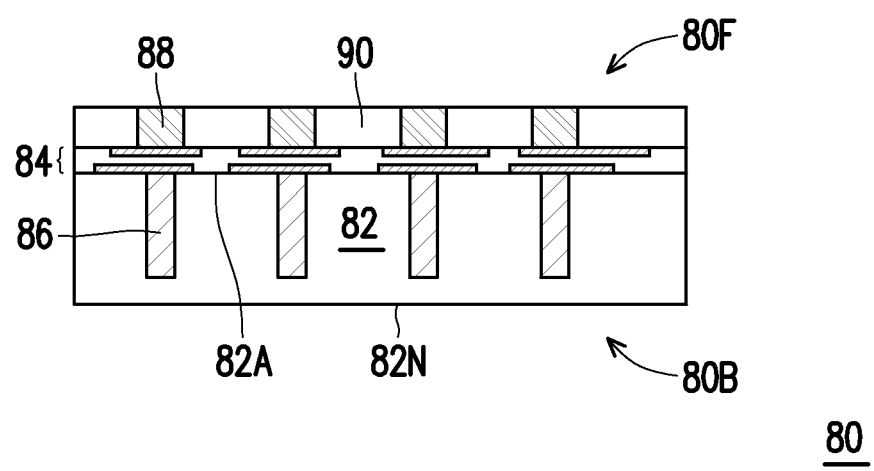

Referring to FIG. 1D, the passive device 80 can be any acceptable passive device, such as an integrated passive device (IPD), a power management integrated circuit (PMIC), an integrated voltage regulator (IVR), or the like. The passive device 80 may be processed according to applicable manufacturing processes to form integrated circuits. For example, the passive device 80 includes a semiconductor substrate 82, which can be similar to the semiconductor substrate 22, but further includes passive devices (e.g., resistors, capacitors, inductors, etc.) and is free of active devices (e.g., transistors, diodes, etc.). The passive device 80 also includes an interconnect structure 84, die connectors 88, and a dielectric layer 90 which, respectively, can be similar to the interconnect structure 24, die connectors 28, and dielectric layer 30. The die connectors 88 and dielectric layer 90 are exposed at a front side 80F of the passive device 80.

The passive device 80 further includes conductive vias 86, which can be similar to the conductive vias 46. In the embodiment illustrated, the conductive vias 86 are not yet exposed at a back side 80B of the passive device 80. Rather, the conductive vias 86 are buried in the semiconductor substrate 82. As discussed further below, the conductive vias 86 will be exposed at the back side 80B of the passive device 80 through a planarization process in subsequent processing.

Chip probe (CP) testing may be performed on the first processor device 20, second processor device 40, memory device 60, and/or passive device 80 to ascertain whether the device(s) are known good die (KGDs). Thus, only devices which are KGDs undergo subsequent processing and are packaged, and devices which fail CP testing do not undergo subsequent processing and are not packaged.

FIGS. 2A through 2D are various view of an integrated circuit package 100, in accordance with some embodiments. The integrated circuit package 100 includes a stack of devices that are bonded together by, e.g., hybrid bonding. The integrated circuit package 100 may be a heterogeneous device, such as a system-on-integrated-chip (SoIC) device. A process for forming the integrated circuit package 100 will be described further below with respect to FIGS. 3A through 8B.

Figure 2A:
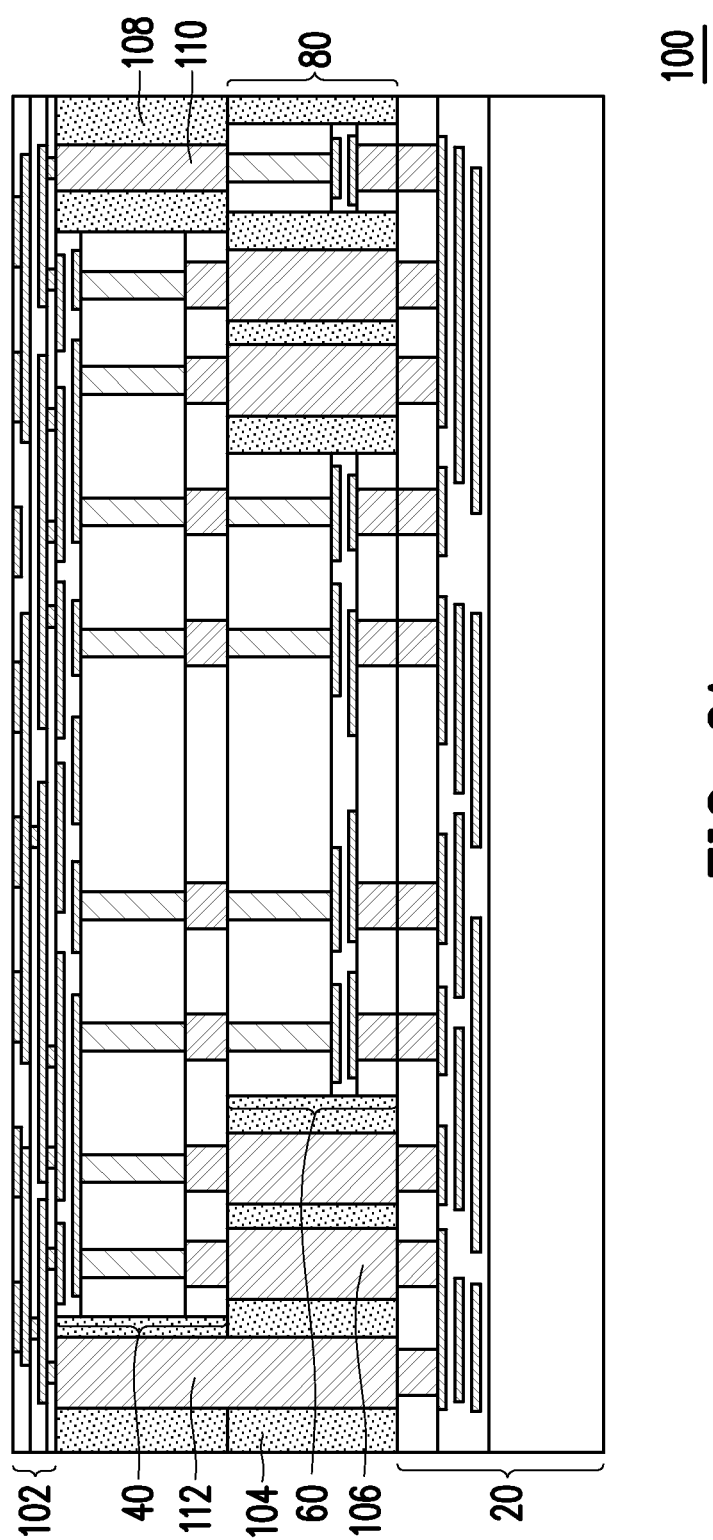
FIGS. 2A, 2B, 2C, and 2D are various views of an integrated circuit package, in accordance with some embodiments.
Figure 2B:
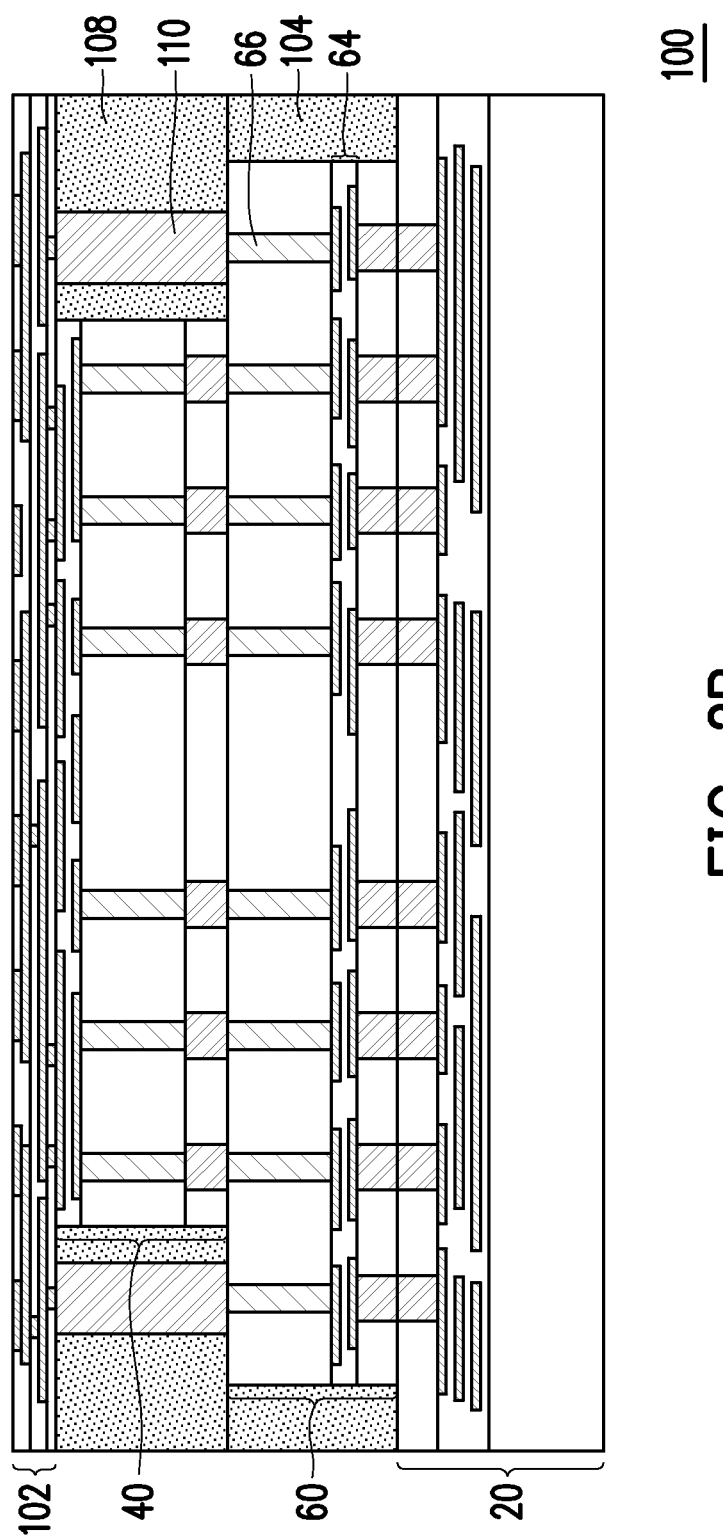
Figure 2C:
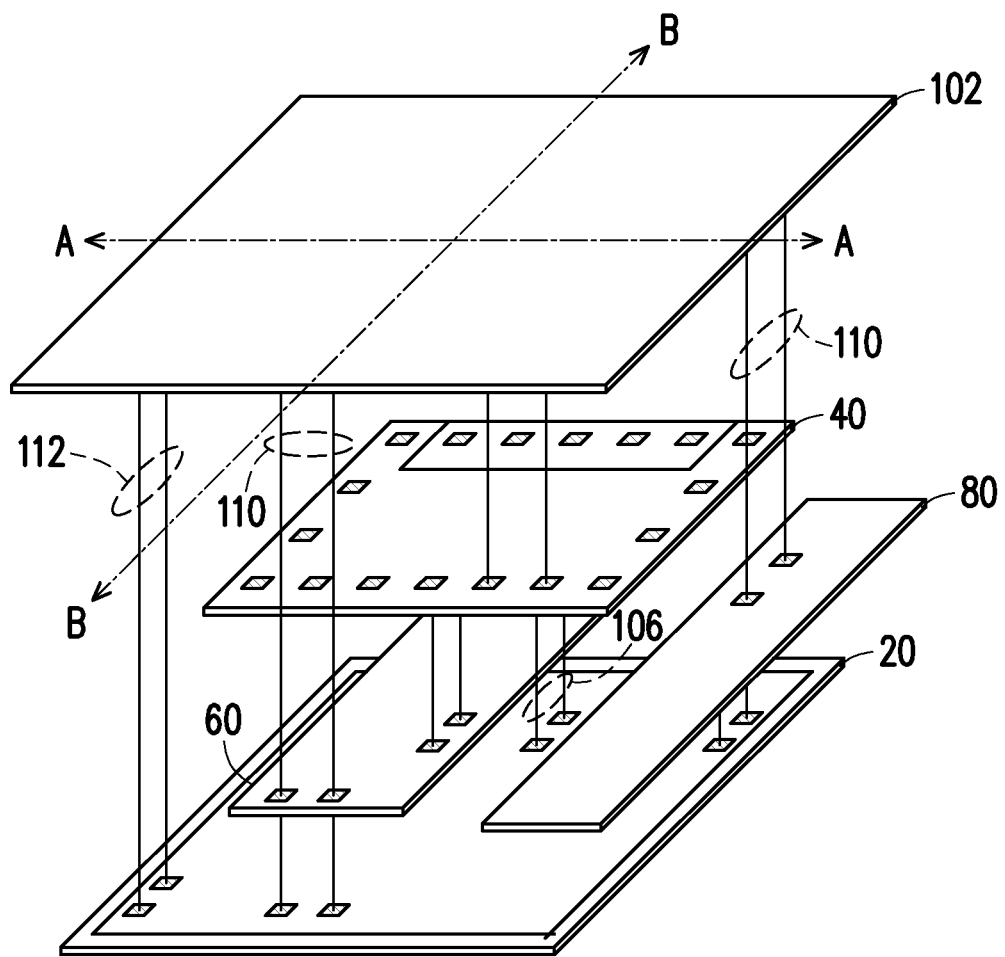
Figure 2D:
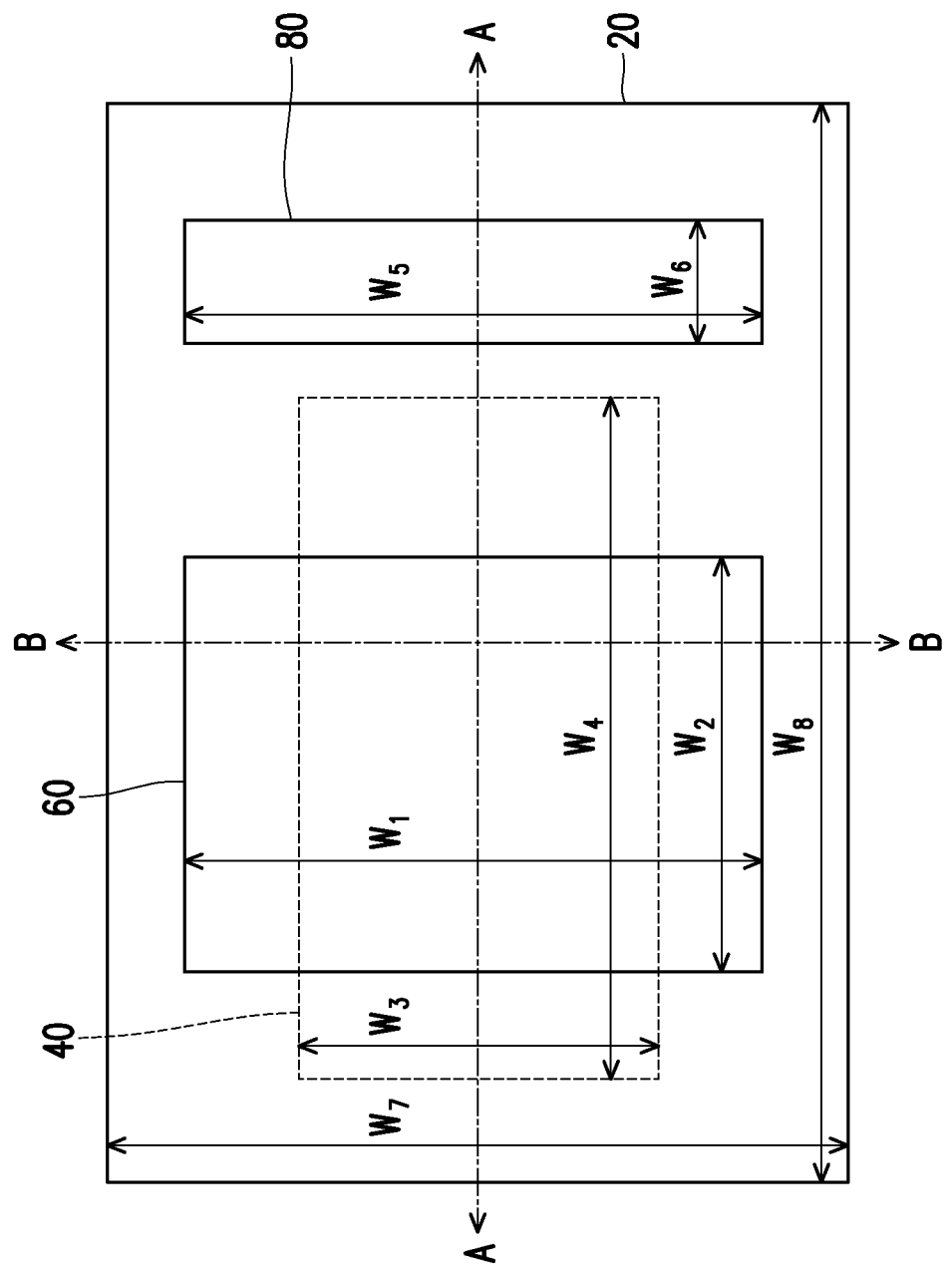

FIGS. 2A and 2B are cross-sectional views of the integrated circuit package 100. FIG. 2C is a three-dimensional diagram illustrating electrical connections among the semiconductor devices of the integrated circuit package 100. FIG. 2D is a top-down view of the integrated circuit package 100 illustrating the positioning of the semiconductor devices. FIG. 2A is illustrated along reference cross-section A-A in FIGS. 2C and 2D, and FIG. 2B is illustrated along reference cross-section B-B in FIGS. 2C and 2D. Cross-section B-B is perpendicular to cross-section A-A. Some features of the first processor device 20, second processor device 40, memory device 60, and passive device 80 are not labeled in FIGS. 2A and 2B for clarity of illustration, but are labeled in FIGS. 1A, 1B, 1C, and 1D, respectively. Further, some features are omitted from FIGS. 2C and 2D for clarity of illustration.

The integrated circuit package 100 includes a first processor device 20, a second processor device 40, a memory device 60, and optionally a passive device 80. In accordance with some embodiments, the first processor device 20 and second processor device 40 are different types of processor devices. For example, the first processor device 20 can be a graphics processor device and the second processor device 40 can be a central processor device. Further, the memory device 60 is electrically coupled to each of the first processor device 20 and second processor device 40, and includes memories that are used by one or both processor devices. For example, the memory device 60 can be a shared memory device, such as a shared level 3 (L3) cache, embedded DRAM (eDRAM), or the like. Using a separate memory device 60 instead of including memories with the first processor device 20 and/or second processor device 40 may allow the overall amount of memory in the integrated circuit package 100 to be increased without substantially increasing manufacturing costs of the processor devices. Further, forming the first processor device 20 and/or second processor device 40 without memories allows more processing units (e.g., cores) to be included in the processor devices without substantially increasing the footprint of the processor devices.

The first processor device 20, second processor device 40, and memory device 60 can have active devices of different technology nodes. Specifically, the first processor device 20 and second processor device 40 can each have active devices of a smaller technology node than the memory device 60. For example, the first processor device 20 and second processor device 40 can each include active devices of a 7 nm technology node, and the memory device 60 can include active devices of a 16 nm technology node. Forming the memory device 60 with a larger technology node allows manufacturing costs of the memory device 60 to be reduced.

The integrated circuit package 100 further includes a redistribution structure 102 (described further below). The redistribution structure 102 includes metallization patterns among dielectric layers. The metallization patterns of the redistribution structure 102 are electrically coupled to the semiconductor devices of the integrated circuit package 100. Specifically, the metallization patterns of the redistribution structure 102 include power supply source lines ($V_{DD}$) and power supply ground lines ($V_{SS}$), which are electrically coupled to each of the first processor device 20, second processor device 40, memory device 60, and passive device 80 to form power delivery networks for the semiconductor devices. In embodiments where the passive device 80 is a PMIC, it can also be part of the power delivery network for the first processor device 20. In some embodiments, the first processor device 20 has its own PMIC and is not connected to the passive device 80.

The metallization patterns of the redistribution structure 102 also include data signal lines that are directly connected to the front side 40F of the second processor device 40. In embodiments where the second processor device 40 is a central processor device, directly connecting the front side 40F of the second processor device 40 to the metallization patterns of the redistribution structure 102 can help increase the quantity of input/output (I/O) connections to the central processor device. Further, the metallization patterns of the redistribution structure 102 can conduct heat away from the second processor device 40, which can be particularly advantageous when the second processor device 40 is a device with a large thermal dissipation, such as a central processor device.

As described further below, data signalling among the semiconductor devices of the integrated circuit package 100 can be accomplished by direct connections (e.g., metal-to-metal bonds) between the semiconductor devices instead of by data signal lines of the redistribution structure 102. The quantity of data signal lines in the redistribution structure 102 may thus be reduced.

Dielectric layers (described further below) are around some of the semiconductor devices of the integrated circuit package 100, thus protecting the semiconductor devices. Conductive vias (described further below) extend through the dielectric layers, thus allowing interconnection of the semiconductor devices of the integrated circuit package 100. Specifically, a first dielectric layer 104 laterally surrounds the memory device 60 and passive device 80, and first conductive vias 106 extend through the first dielectric layer 104. The first conductive vias 106 connect the front side 20F of the first processor device 20 to the back side 40B of the second processor device 40. Likewise, a second dielectric layer 108 laterally surrounds the second processor device 40, and second conductive vias 110 extend through the second dielectric layer 108. The second conductive vias 110 connect the redistribution structure 102 to the back side 60B of the memory device 60 and to the back side 80B of the passive device 80. Some conductive vias extend through multiple dielectric layers. Specifically, third conductive vias 112 extend through both the first dielectric layer 104 and second dielectric layer 108. The third conductive vias 112 connect the redistribution structure 102 to the front side 20F of the first processor device 20. In some embodiments, the second conductive vias 110 and third conductive vias 112 are electrically coupled to the power supply source lines ($V_{DD}$) and power supply ground lines ($V_{SS}$) of the redistribution structure 102, and provide power and ground connections to the semiconductor devices of the integrated circuit package 100. In some embodiments, some of the second conductive vias 110 and third conductive vias 112 are also electrically coupled to data signal lines of the redistribution structure 102.

The semiconductor devices of the integrated circuit package 100 can have different sizes so that they do not concentrically overlap one another, thus allowing sufficient space for connection to the conductive vias 106, 110, 112 and redistribution structure 102. Specifically, the widths of the semiconductor devices can differ in different cross-sectional views.

The memory device 60 is narrower than the second processor device 40 in a first plane (e.g., the cross-section illustrated in FIG. 2A) and the memory device 60 is wider than the second processor device 40 in a second plane (e.g., the cross-section illustrated in FIG. 2B). For example, referring to FIG. 2D, the memory device 60 can have widths $W_1$ and $W_2$, and the second processor device 40 can have widths $W_3$ and $W_4$, with the width $W_1$ being greater than the width $W_3$, and the width $W_2$ being less than the width $W_4$.

The passive device 80 is narrower than the second processor device 40 in the first plane (e.g., the cross-section illustrated in FIG. 2A) and the passive device 80 is wider than the second processor device 40 in the second plane (e.g., the cross-section illustrated in FIG. 2B). For example, referring to FIG. 2D, the passive device 80 can have widths $W_5$ and $W_6$, with the width $W_5$ being greater than the width $W_3$, and the width $W_6$ being less than the width $W_4$.

The first processor device 20 is wider than the second processor device 40, memory device 60, and passive device 80 in the first plane (e.g., the cross-section illustrated in FIG. 2A) and the second plane (e.g., the cross-section illustrated in FIG. 2B). For example, referring to FIG. 2D, the first processor device 20 can have widths $W_7$ and $W_8$, with the width $W_7$ being greater than each of the widths $W_1, W_3$, and $W_5$, and with the width $W_8$ being greater than each of the widths $W_2, W_4$, and $W_6$.

The memory device 60 is disposed between the first processor device 20 and second processor device 40, and is bonded to both processor devices. The first processor device 20 is directly face-to-face bonded to the memory device 60. For example, the front side 20F of the first processor device 20 can be bonded to the front side 60F of the memory device 60 by hybrid bonds (e.g., by metal-to-metal bonds and by dielectric-to-dielectric bonds). The second processor device 40 is directly back-to-back bonded to the memory device 60. For example, the back side 40B of the second processor device 40 can be bonded to the back side 60B of the memory device 60 by hybrid bonds (e.g., by metal-to-metal bonds and by dielectric-to-dielectric bonds). The second processor device 40 is also be bonded to other features of the integrated circuit package 100. Specifically, the second processor device 40 is directly bonded to portions of the first dielectric layer 104 and some of the first conductive vias 106. For example, the back side 40B of the second processor device 40 can be bonded to portions of the first dielectric layer 104 by dielectric-to-dielectric bonds, and the back side 40B of the second processor device 40 can also be bonded to some of the first conductive vias 106 by metal-to-metal bonds.

In embodiments where the passive device 80 is included, it is bonded to the first processor device 20. The passive device 80 is directly face-to-face bonded to the first processor device 20. For example, the front side 80F of the passive device 80 can be bonded to the front side 20F of the first processor device 20 by hybrid bonds (e.g., by metal-to-metal bonds and by dielectric-to-dielectric bonds). The passive device 80 is laterally disposed outside of the footprint of the second processor device 40, and is not bonded to the second processor device 40.

After packaging, the first processor device 20 and second processor device 40 can be interconnected by several features. The first processor device 20 and second processor device 40 can communicate directly through the first conductive vias 106. Further, due to the interconnections created by the direct bonds, the first processor device 20 and second processor device 40 can communicate indirectly through the memory device 60. Specifically, the first processor device 20 and second processor device 40 can communicate through the interconnect structure 64 and conductive vias 66 of the memory device 60. Data signaling between the semiconductor devices is performed over these interconnections, which are shorter than the redistribution lines of the redistribution structure 102. The latency of data signaling and the interconnection bandwidth among the semiconductor devices of the integrated circuit package 100 may thus be reduced. Further, the impedance and thus power consumption of the connections may also be reduced.

FIGS. 3A through 8B are cross-sectional views of intermediate steps during a process for forming an integrated circuit package 100, in accordance with some embodiments. FIGS. 3A, 4A, 5A, 6A, 7A, and 8A are cross-sectional views along reference cross-section A-A in FIGS. 2C and 2D. FIGS. 3B, 4B, 5B, 6B, 7B, and 8B are cross-sectional views along reference cross-section B-B in FIGS. 2C and 2D. The integrated circuit package 100 is formed by stacking devices on an unsingulated wafer 120. Stacking of devices in one device region 120A of the wafer 120 is illustrated, but it should be appreciated that the wafer 120 may have any number of device regions and devices may be stacked in each device region.

Figure 3A:
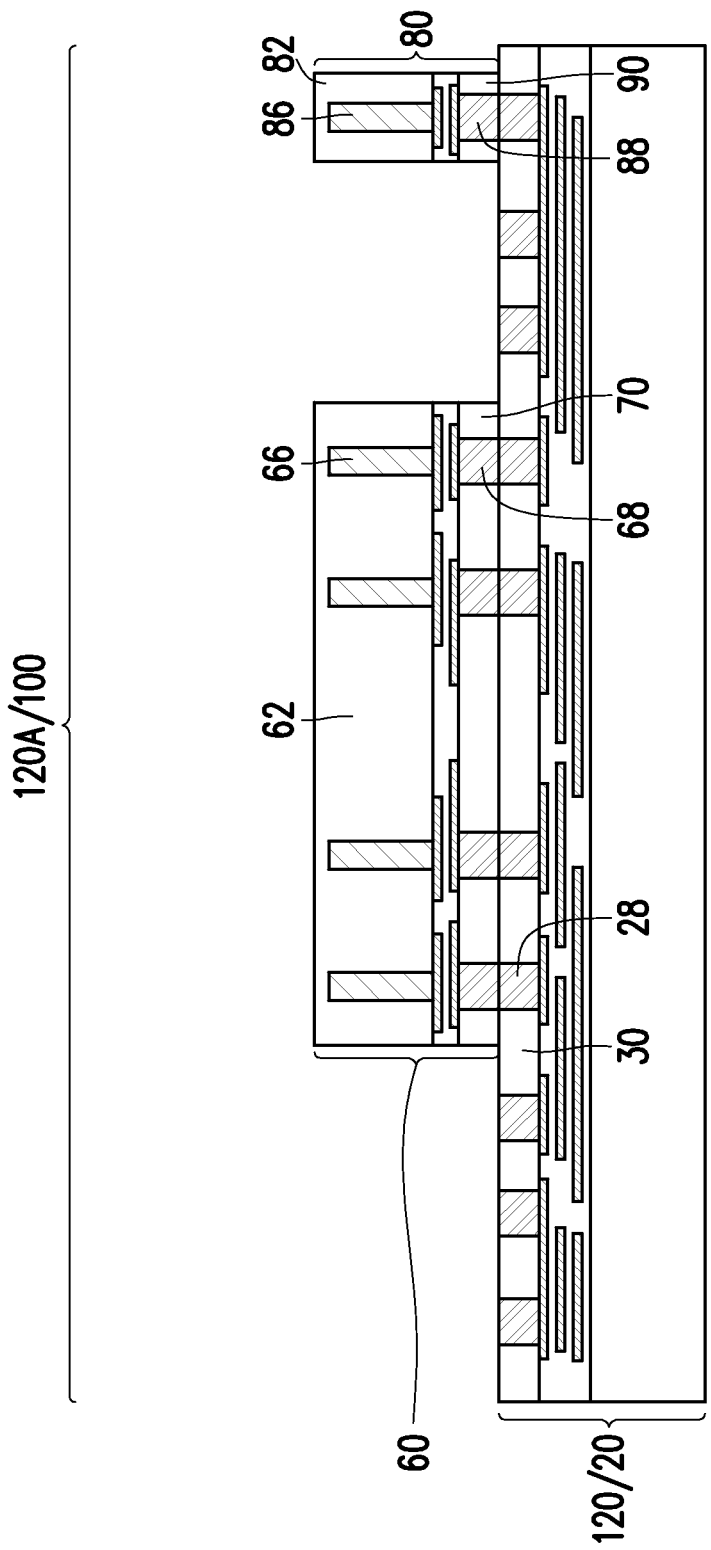
Figure 3B:
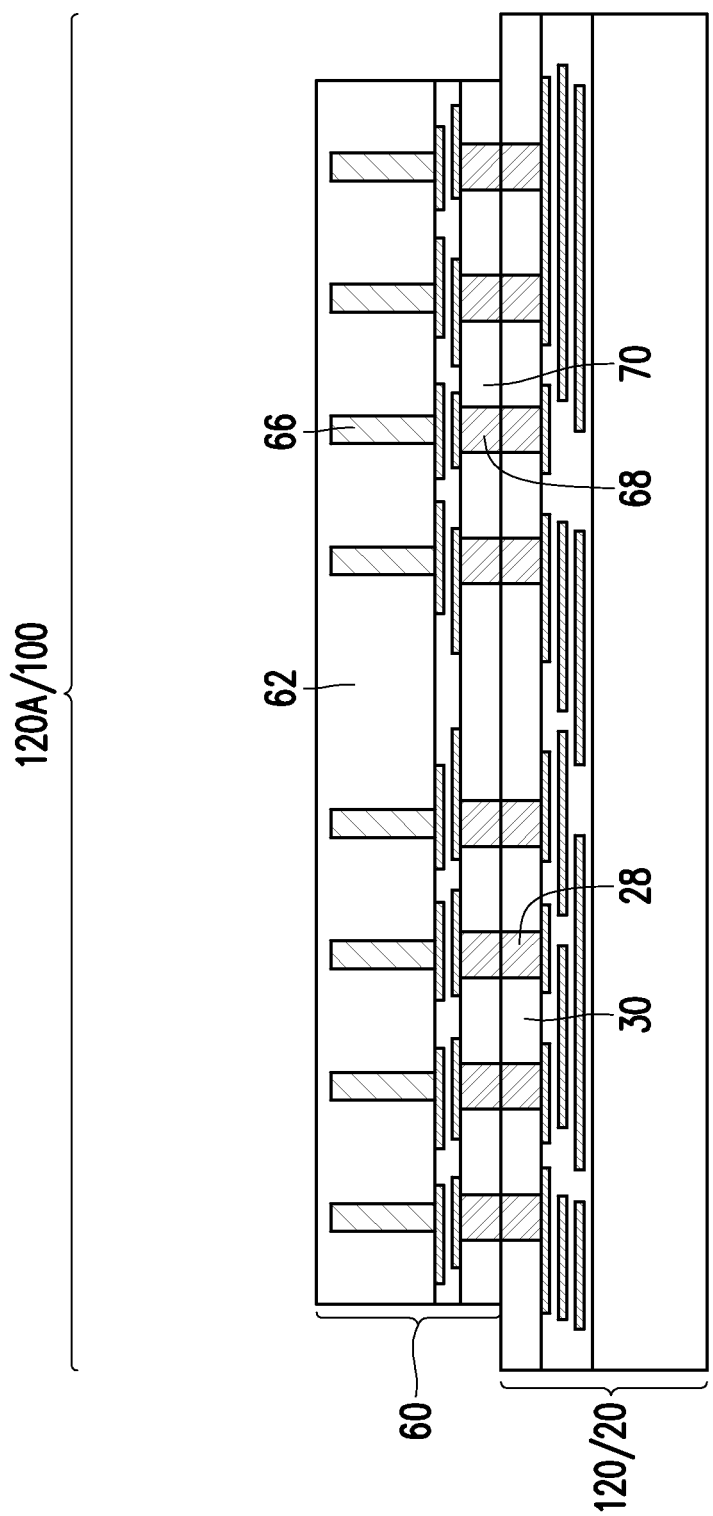

In FIGS. 3A and 3B, the wafer 120 is obtained. The wafer 120 comprises a first processor device 20 in the device region 120A. As such, the device region 120A of the wafer 120 has similar features as the first processor device 20. The first processor device 20 will be singulated in subsequent processing (see FIGS. 8A and 8B) to be included in the integrated circuit package 100.

A memory device 60 is bonded to the first processor device 20 (e.g., to the wafer 120). The first processor device 20 and memory device 60 are directly bonded in a face-to-face manner by hybrid bonding, where the dielectric layer 30 of the first processor device 20 is bonded to the dielectric layer 70 of the memory device 60 through dielectric-to-dielectric bonding, without using any adhesive material (e.g., die attach film), and where the die connectors 28 of the first processor device 20 are bonded to the die connectors 68 of the memory device 60 through metal-to-metal bonding, without using any eutectic material (e.g., solder).

The bonding may include a pre-bonding and an annealing. During the pre-bonding, a small pressing force is applied to press the first processor device 20 and memory device 60 against each other. The pre-bonding is performed at a low temperature, such as room temperature, such as a temperature in the range of about 15° C. to about 30° C., and after the pre-bonding, the dielectric layers 30 and 70 are bonded to each other. The bonding strength is then improved in a subsequent annealing step, in which the dielectric layers 30 and 70 are annealed at a high temperature, such as a temperature in the range of about 100° C. to about 450° C. After the annealing, direct bonds, such as fusions bonds, are formed bonding the dielectric layers 30 and 70. For example, the bonds can be covalent bonds between the material of the dielectric layer 30 and the material of the dielectric layer 70. The die connectors 28 and 68 are physically and electrically connected to each other with a one-to-one correspondence. The die connectors 28 and 68 may be in physical contact after the pre-bonding, or may expand to be brought into physical contact during the annealing. Further, during the annealing, the material of the die connectors 28 and 68 (e.g., copper) intermingles, so that metal-to-metal bonds are also formed. Hence, the resulting bonds between the first processor device 20 and memory device 60 are hybrid bonds that include both dielectric-to-dielectric bonds and metal-to-metal bonds.

A passive device 80 is optionally bonded to the first processor device 20 (e.g., to the wafer 120). The first processor device 20 and passive device 80 are directly bonded in a face-to-face manner by hybrid bonding, where the dielectric layer 30 of the first processor device 20 is bonded to the dielectric layer 90 of the passive device 80 through dielectric-to-dielectric bonding, without using any adhesive material (e.g., die attach film), and where the die connectors 28 of the of the first processor device 20 are bonded to the die connectors 88 of the passive device 80 through metal-to-metal bonding, without using any eutectic material (e.g., solder). The hybrid bonding may be similar to the bonding of the first processor device 20 and memory device 60, described above.

Figure 4A:
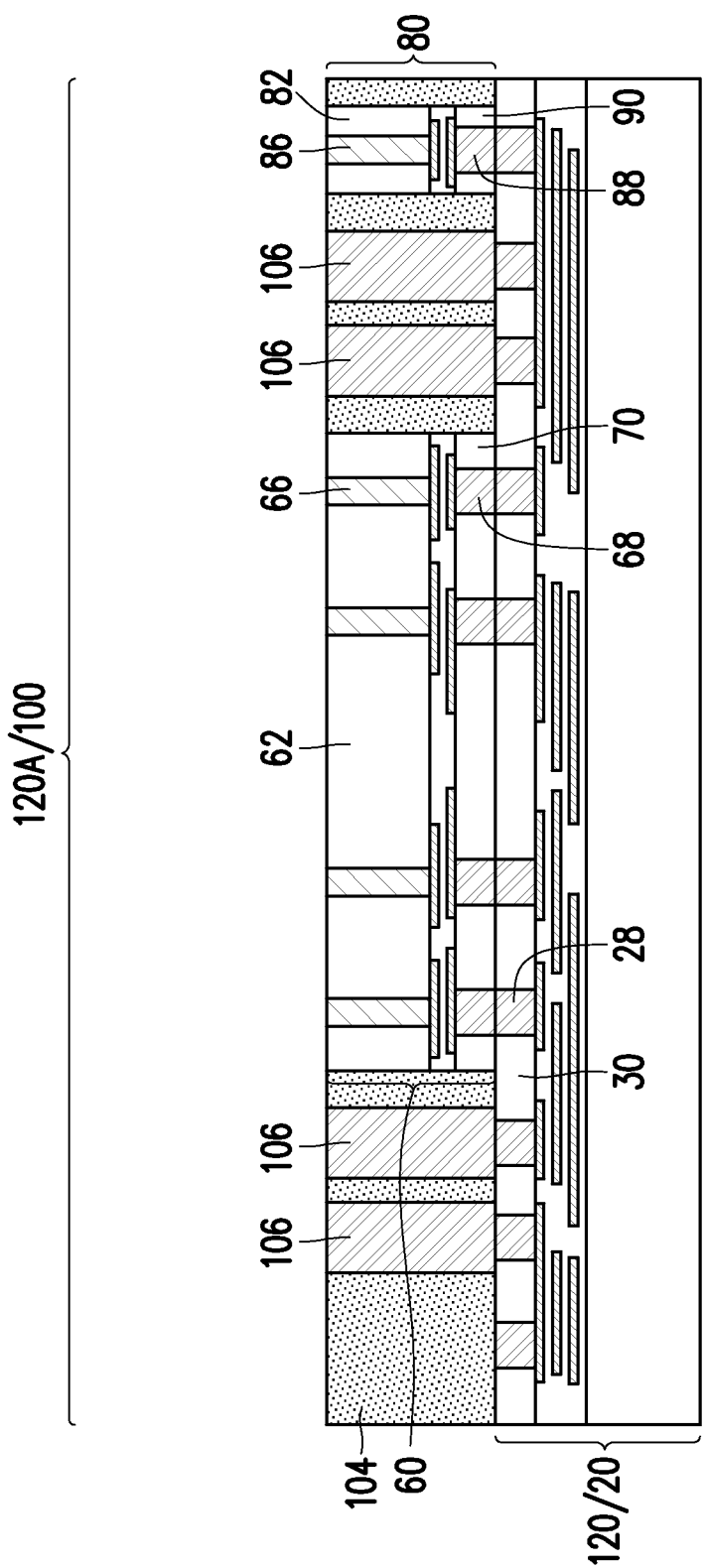
Figure 4B:
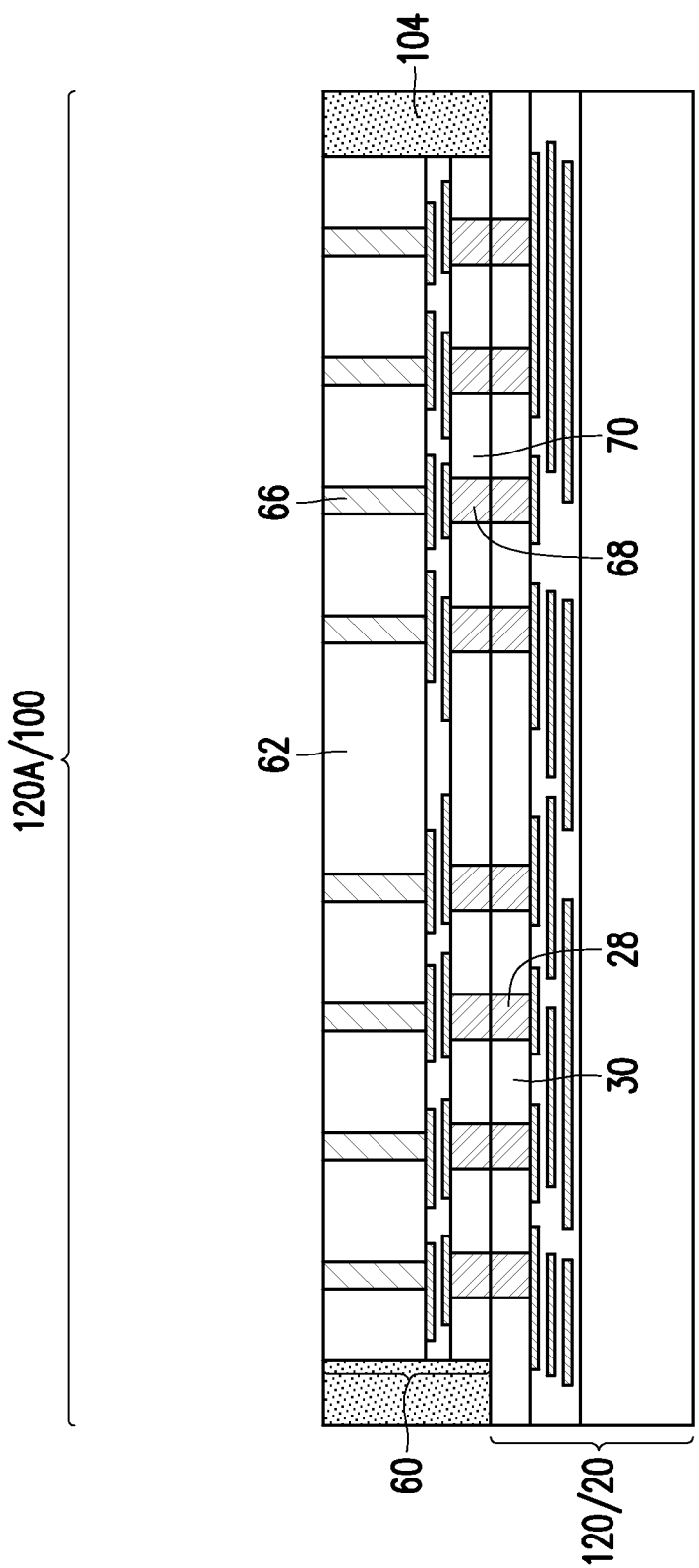

In FIGS. 4A and 4B, a first dielectric layer 104 is formed surrounding the memory device 60 and passive device 80. The first dielectric layer 104 can be formed after placement of the memory device 60 and passive device 80 but before annealing to complete the hybrid bonding, or can be formed after annealing. The first dielectric layer 104 fills gaps between the memory device 60 and passive device 80, thus protecting the semiconductor devices. The first dielectric layer 104 may be an oxide such as silicon oxide, PSG, BSG, BPSG, or the like; a nitride such as silicon nitride or the like; a polymer such as polybenzoxazole (PBO), polyimide, benzocyclobuten (BCB), or the like; an encapsulant such as a molding compound, epoxy, or the like; the like, or a combination thereof. In some embodiments, the first dielectric layer 104 is an oxide such as silicon oxide.

First conductive vias 106 are then formed to extend through the first dielectric layer 104. As an example to form the first conductive vias 106, openings are patterned in the first dielectric layer 104. The patterning may be by an acceptable process, such as by exposing the first dielectric layer 104 to light when the first dielectric layer 104 is a photo-sensitive material, or by etching the first dielectric layer 104 using, for example, an anisotropic etch. The openings expose the die connectors 28 of the first processor device 20. A seed layer is formed on the first dielectric layer 104 and on portions of the die connectors 28 exposed by the openings. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A conductive material is formed on the seed layer. The conductive material may be formed by plating, such as electroplating or electroless plating, or the like. The conductive material may comprise a metal, such as copper, titanium, tungsten, aluminum, or the like. Excess portions of the seed layer and conductive material are then removed, with the excess portions being portions overlying the first dielectric layer 104. The removal may be by a planarization process. The planarization process is performed on the seed layer, conductive material, first dielectric layer 104, and semiconductor substrates 62 and 82. The removal simultaneously removes excess portions of the seed layer and conductive material and exposes the conductive vias 66 and 86. The planarization process may be, for example, a CMP process, a grinding process, an etch back process, the like, or combinations thereof. The remaining portions of the seed layer and conductive material in the openings form the first conductive vias 106. Top surfaces of the first dielectric layer 104, first conductive vias 106, semiconductor substrates 62 and 82, and conductive vias 66 and 86 are planar after the planarization process.

Figure 5A:
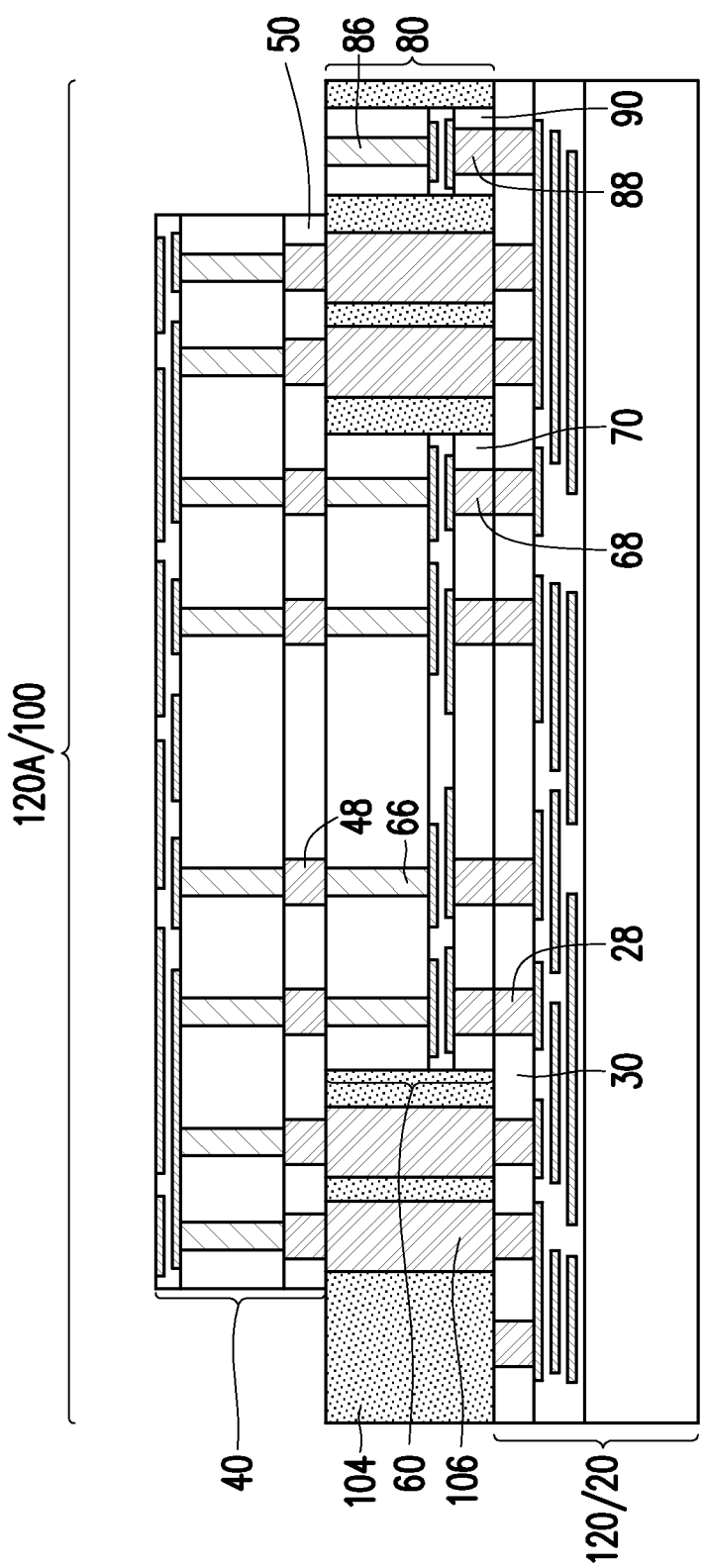
Figure 5B:
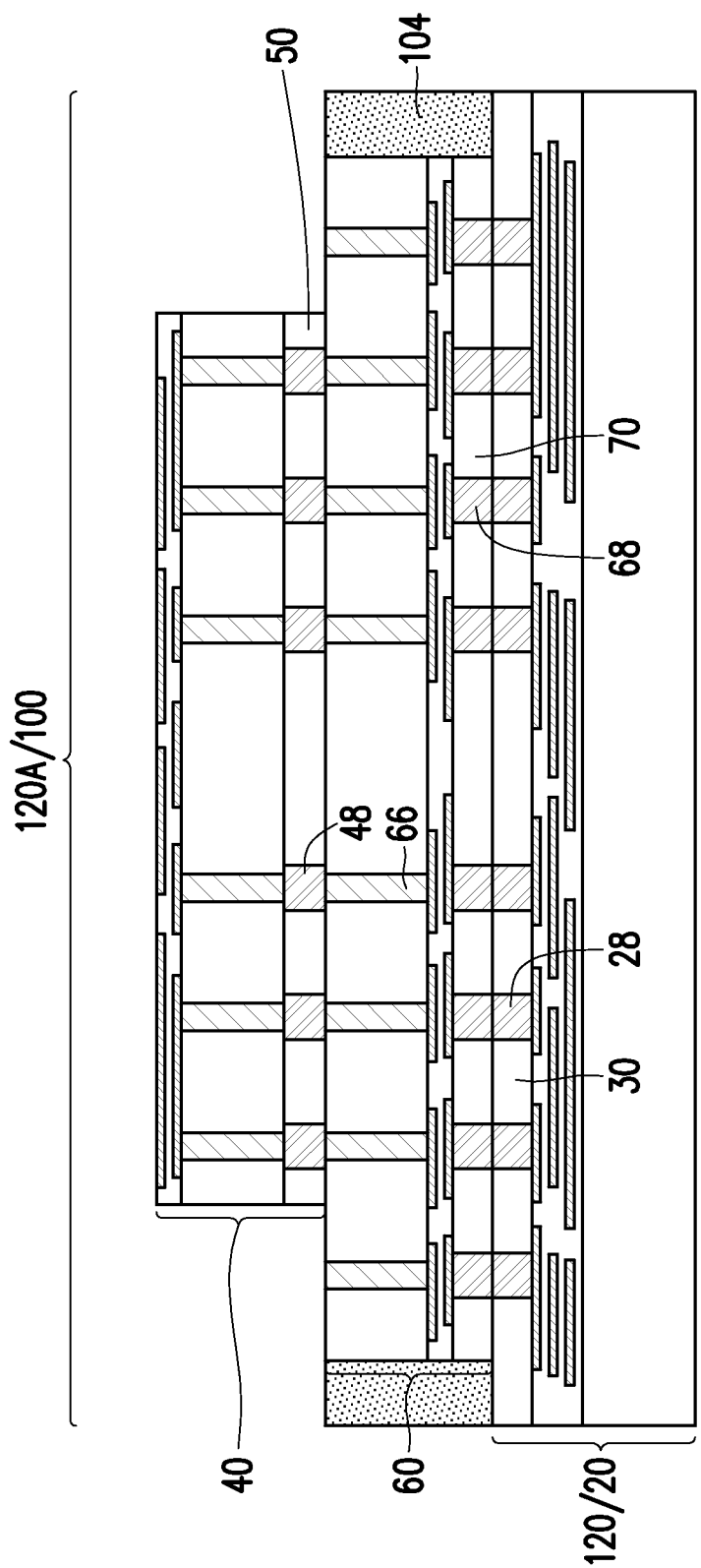

In FIGS. 5A and 5B, a second processor device 40 is bonded to the memory device 60, first conductive vias 106, and first dielectric layer 104. The second processor device 40 and memory device 60 are directly bonded in a back-to-back manner by hybrid bonding. Because the second processor device 40 and memory device 60 do not concentrically overlap one another, some portions of the first conductive vias 106 and first dielectric layer 104 participating in the hybrid bonding. Specifically, the dielectric layer 50 of the second processor device 40 is bonded to portions of the first dielectric layer 104 through dielectric-to-dielectric bonding, without using any adhesive material (e.g., die attach film). Likewise, the die connectors 48 of the second processor device 40 are bonded to the first conductive vias 106 and the conductive vias 66 of the memory device 60 through metal-to-metal bonding, without using any eutectic material (e.g., solder). The hybrid bonding may be similar to the bonding of the first processor device 20 and memory device 60, described above. Because the first dielectric layer 104 participates in the hybrid bonding, strong dielectric-to-dielectric bonds to the second processor device 40 can be formed even though no dielectric features of the memory device 60 are exposed.

Figure 6A:
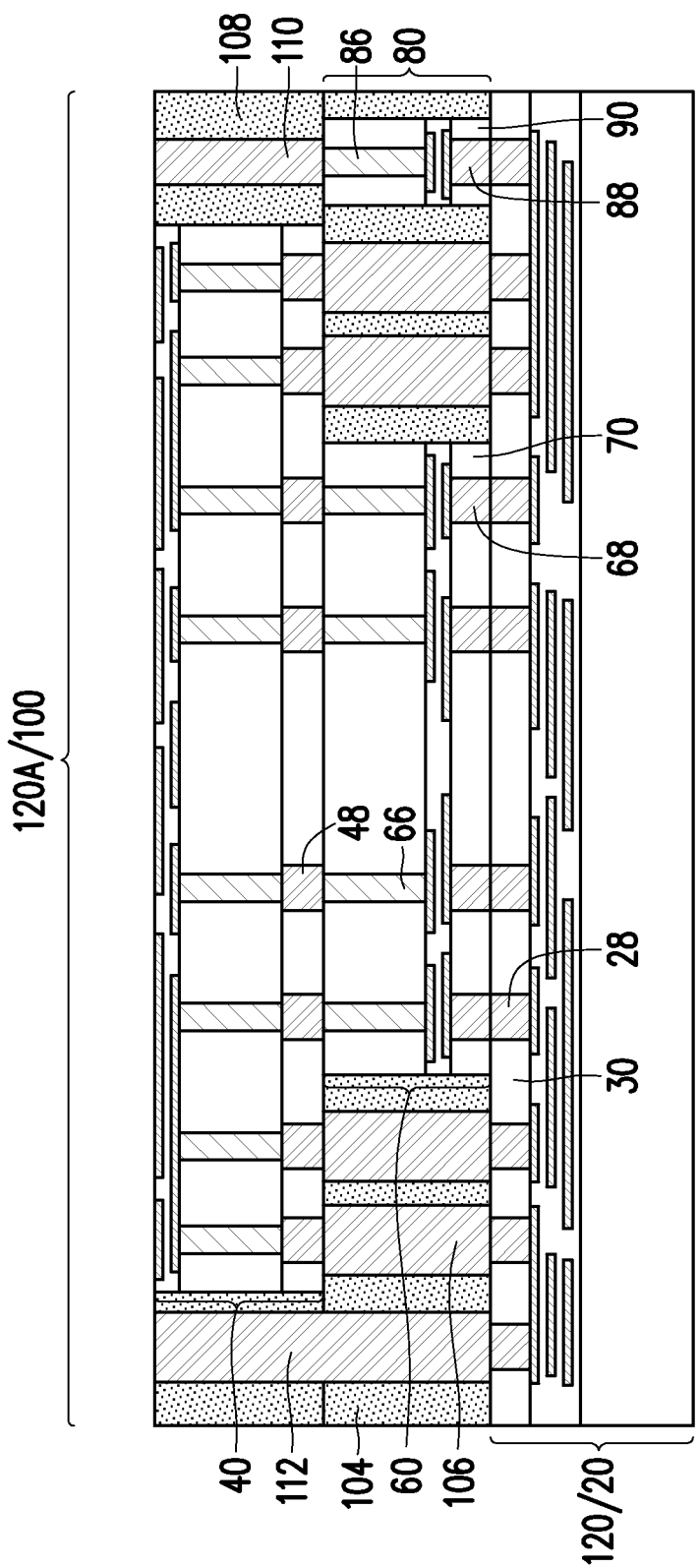
Figure 6B:
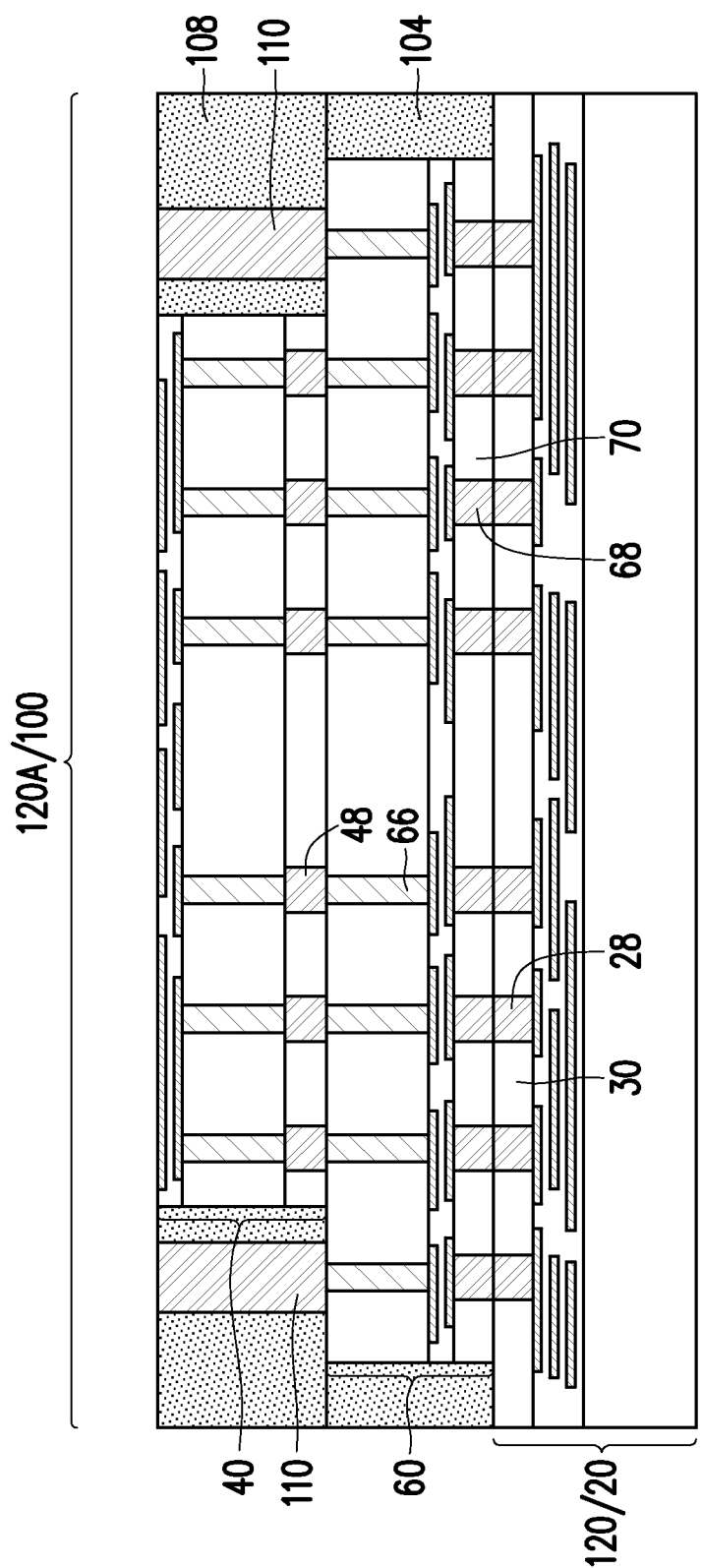

In FIGS. 6A and 6B, a second dielectric layer 108 is formed surrounding the second processor device 40. The second dielectric layer 108 can be formed after placement of the second processor device 40 but before annealing to complete the hybrid bonding, or can be formed after annealing. The second dielectric layer 108 may be formed of a similar material and by a similar method as the first dielectric layer 104. In some embodiments, the second dielectric layer 108 is an oxide such as silicon oxide.

Second conductive vias 110 are then formed to extend through the second dielectric layer 108 and connect to the conductive vias 66 and 86. The second conductive vias 110 may be formed of a similar material and by a similar method as the first conductive vias 106. Third conductive vias 112 are then formed to extend through the first dielectric layer 104 and second dielectric layer 108 and connect to the die connectors 28. The third conductive vias 112 may be formed of a similar material and by a similar method as the first conductive vias 106, except the openings for the third conductive vias 112 can be patterned through both the first dielectric layer 104 and second dielectric layer 108. In some embodiments, the second conductive vias 110 and third conductive vias 112 are formed simultaneously. During formation of the second conductive vias 110 and/or third conductive vias 112, a planarization process can be performed. Top surfaces of the second dielectric layer 108, second conductive vias 110, third conductive vias 112, and second processor device 40 are planar after the planarization process.

Figure 7A:
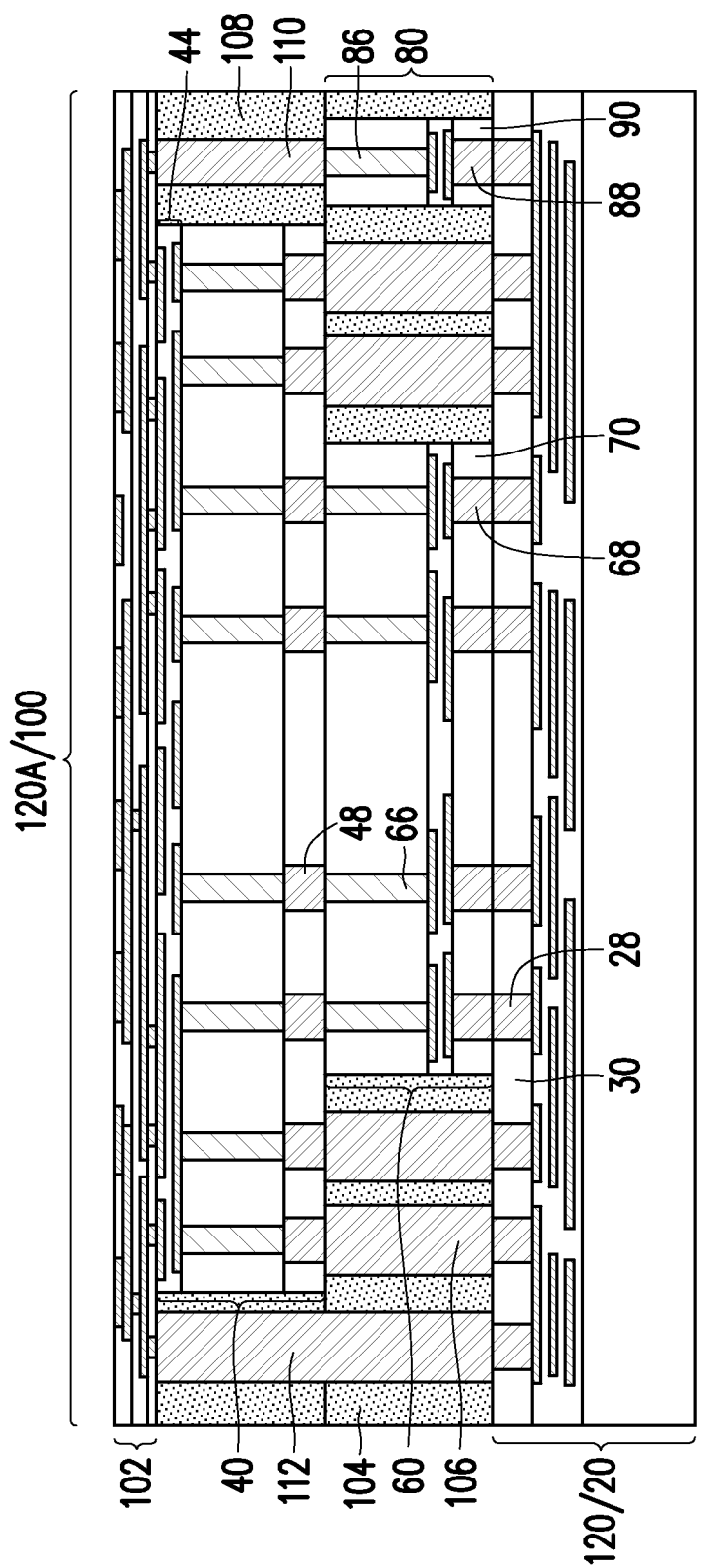
Figure 7B:
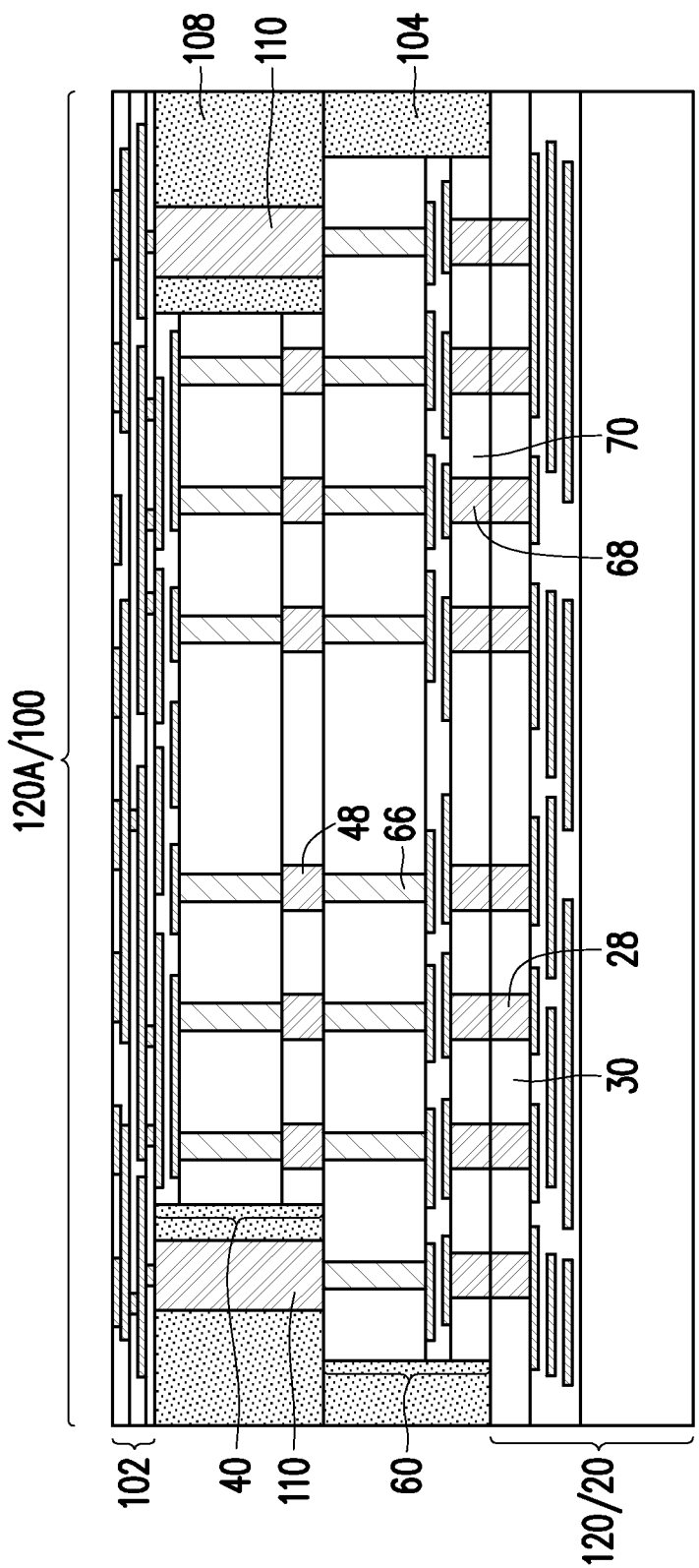

In FIGS. 7A and 7B, a redistribution structure 102 is formed on the second dielectric layer 108, second conductive vias 110, third conductive vias 112, and second processor device 40. The redistribution structure 102 includes multiple dielectric layers, metallization patterns, and vias. For example, the redistribution structure 102 may be patterned as a plurality of discrete metallization patterns separated from each other by respective dielectric layers. In some embodiments, the dielectric layers are formed of a polymer, which may be a photo-sensitive material such as PBO, polyimide, BCB, or the like, may be patterned using a lithography mask. In other embodiments, the dielectric layers are formed of a nitride such as silicon nitride; an oxide such as silicon oxide, PSG, BSG, BPSG; or the like. The dielectric layers may be formed by spin coating, lamination, CVD, the like, or a combination thereof. After formation, the dielectric layers are patterned to expose underlying conductive features. For example, the bottom dielectric layer is patterned to expose portions of the metallization pattern(s) of the interconnect structure 44, and intermediate dielectric layer(s) are patterned to expose portions of underlying metallization patterns. The patterning may be by an acceptable process, such as by exposing the dielectrics layers to light when the dielectric layers are a photo-sensitive material, or by etching using, for example, an anisotropic etch. If the dielectric layers are photo-sensitive materials, the dielectric layers can be developed after the exposure.

Metallization patterns are formed extending along and through each dielectric layer. A seed layer (not illustrated) is formed over each respective dielectric layer and in the openings through the respective dielectric layer. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photoresist is then formed and patterned on the seed layer. The photoresist may be formed by spin coating or the like and may be exposed to light for patterning. The pattern of the photoresist corresponds to the metallization pattern. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal or a metal alloy, such as copper, titanium, tungsten, aluminum, the like, or combinations thereof. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern for one layer of the redistribution structure 102.

The redistribution structure 102 is illustrated as an example. More or fewer dielectric layers and metallization patterns than illustrated may be formed in the redistribution structure 102 by repeating or omitting the steps described above.

Figure 8A:
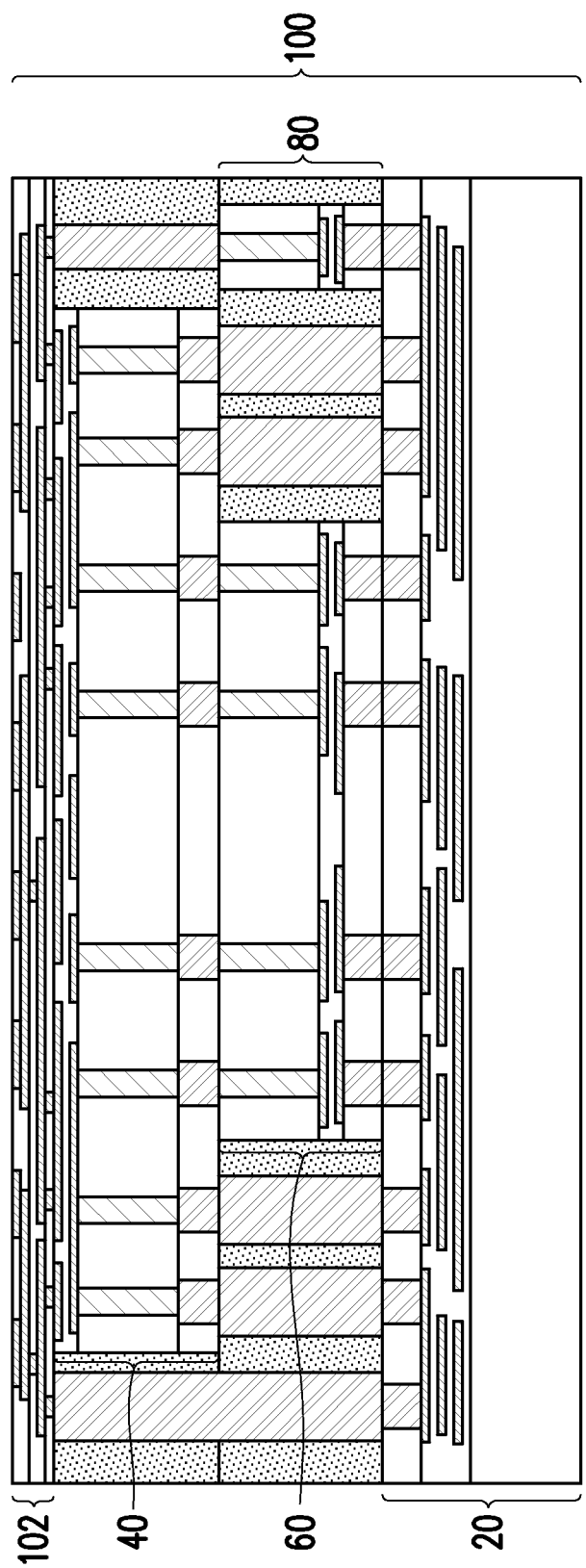

In FIGS. 8A and 8B, a singulation process is performed by sawing along scribe line regions, e.g., around the device region 120A. The singulation process includes sawing the redistribution structure 102, first dielectric layer 104, second dielectric layer 108, and wafer 120. The singulation process separates the device region 120A (comprising the first processor device 20) from adjacent device regions (not illustrated) of the wafer 120 to form an integrated circuit package 100 comprising the first processor device 20. The memory device 60 is bonded to the first processor device 20 in a face-to-face manner, and the memory device 60 is bonded to the second processor device 40 in a back-to-back manner, without the use of solder. The resulting integrated circuit package 100 is thus free from solder. After singulation, the redistribution structure 102, first dielectric layer 104, second dielectric layer 108, and first processor device 20 are laterally coterminous.

Figure 9A:
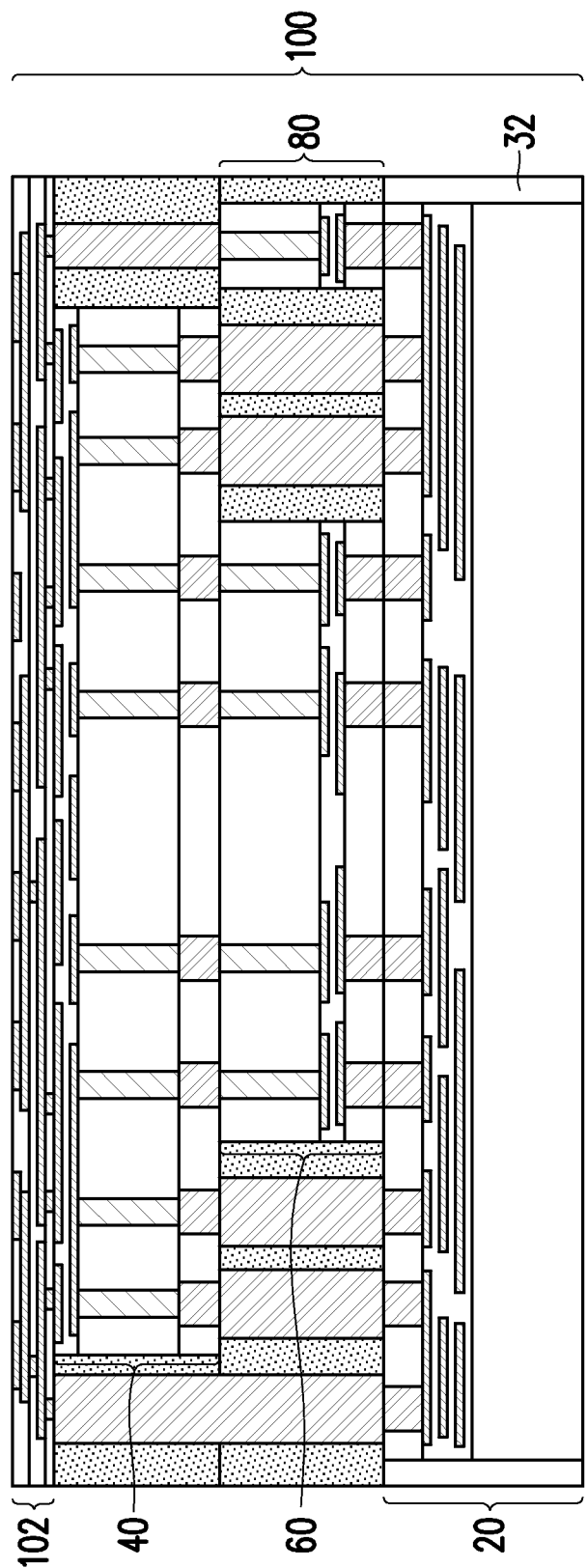
FIGS. 9A and 9B are cross-sectional views of an integrated circuit package, in accordance with some embodiments.
Figure 9B:
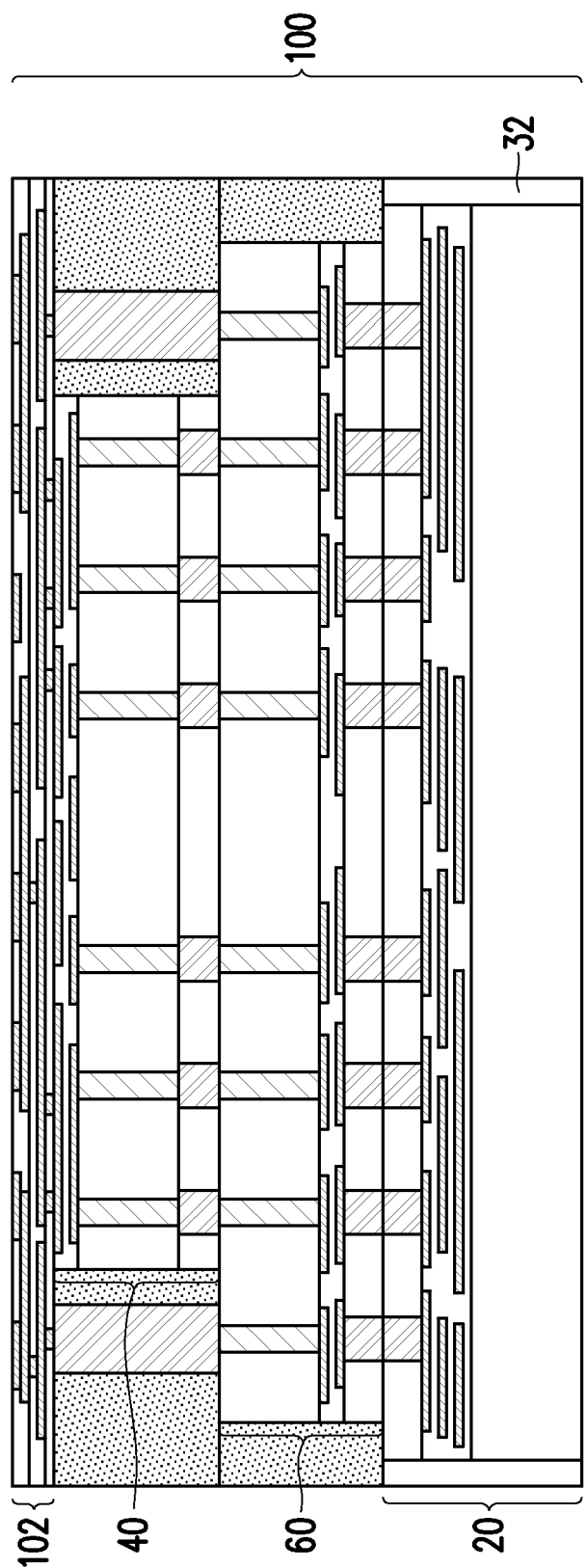

FIGS. 9A and 9B are cross-sectional views of an integrated circuit package 100, in accordance with some embodiments. FIG. 9A is illustrated along reference cross-section A-A in FIGS. 2C and 2D. FIG. 9B is illustrated along reference cross-section B-B in FIGS. 2C and 2D. In this embodiment, the first processor device 20 is not a bare integrated circuit die, but rather is a packaged die. The first processor device 20 can be formed by obtaining a wafer comprising the first processor device 20, sawing the wafer to singulate the first processor device 20, and then encapsulating the first processor device 20 with an encapsulant 32. The other semiconductor devices of the integrated circuit package 100 can then be stacked on the encapsulated first processor device 20.

Figure 10:
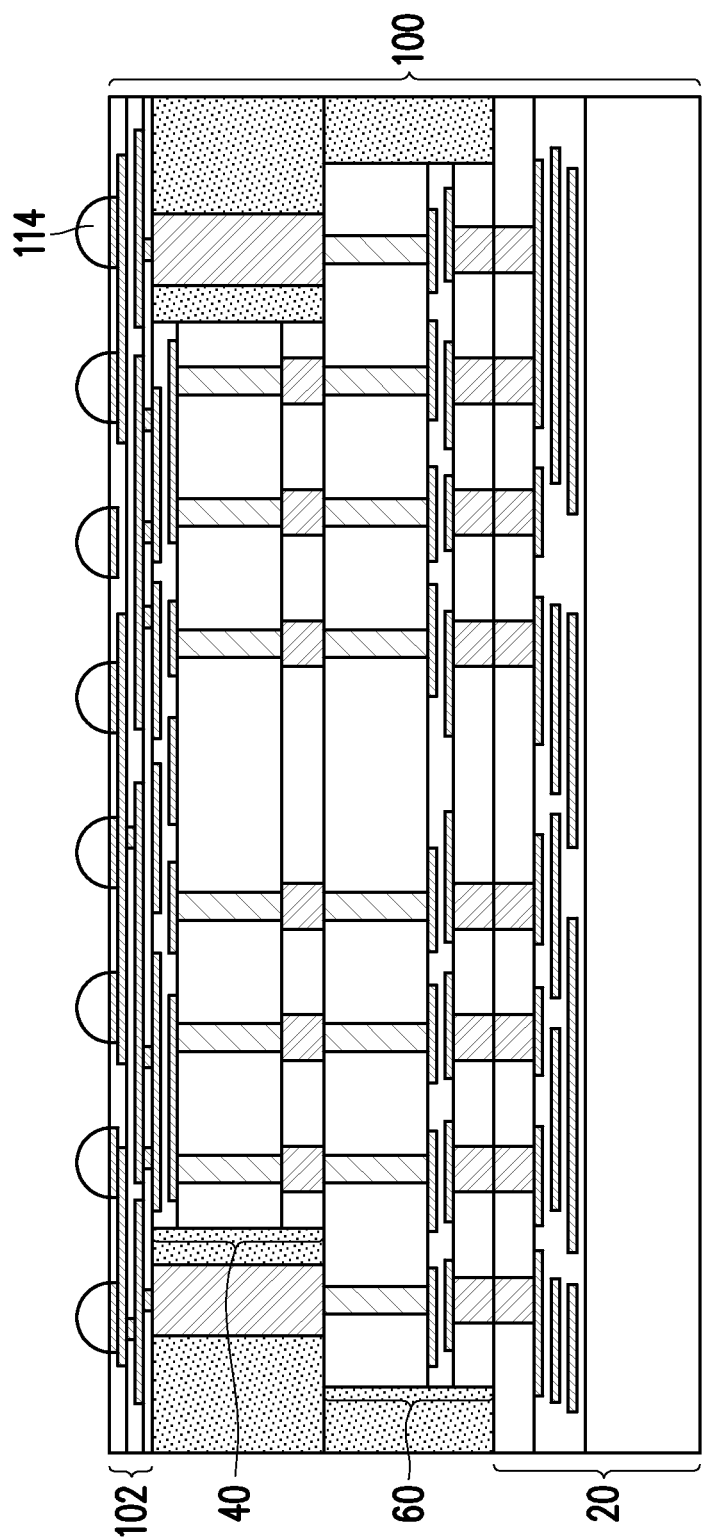
FIGS. 10 and 11 are cross-sectional views of intermediate steps during a process for forming a system implementing an integrated circuit package, in accordance with some embodiments.
Figure 11:
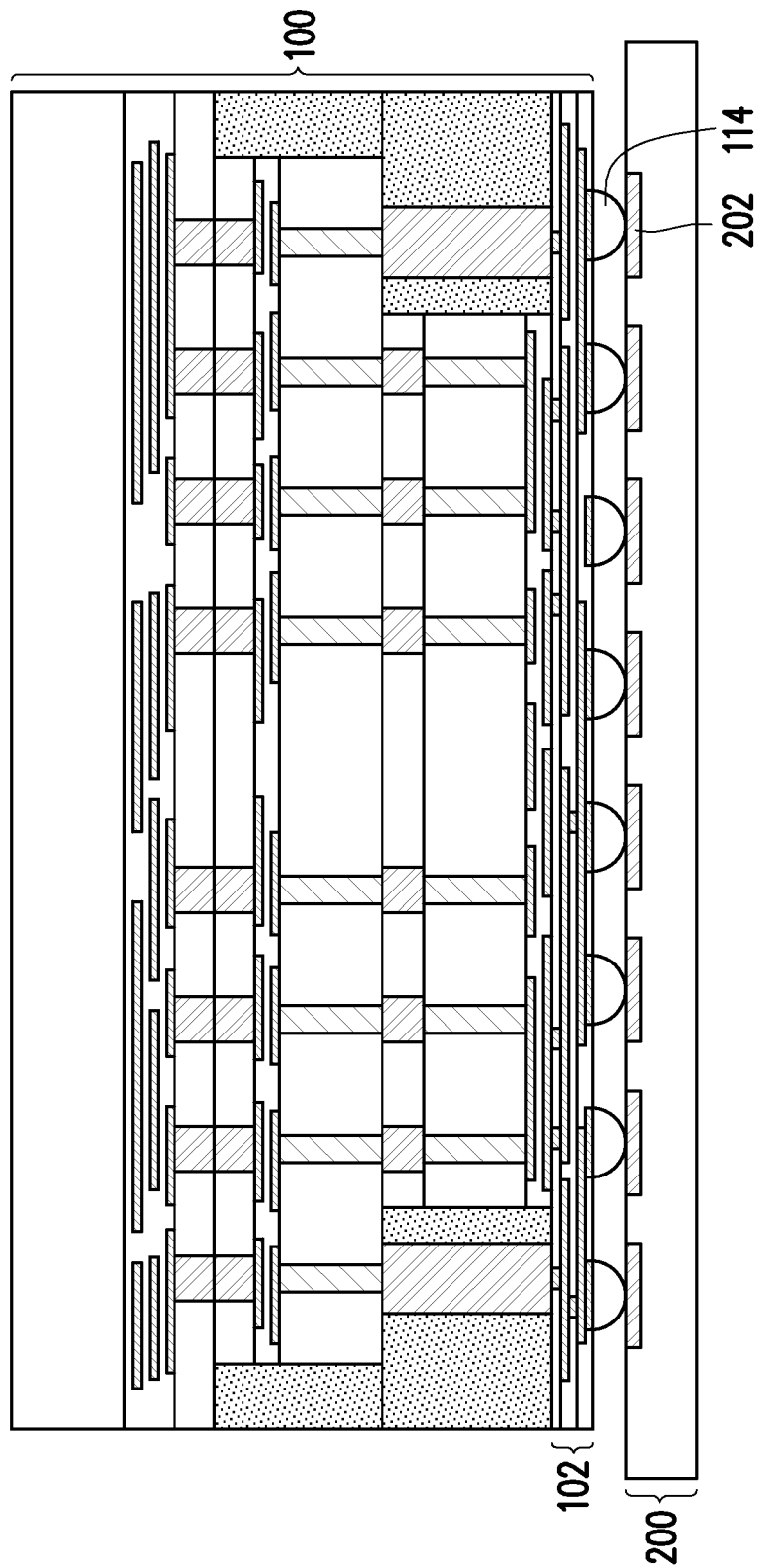

FIGS. 10 and 11 are cross-sectional views of intermediate steps during a process for forming a system implementing an integrated circuit package 100, in accordance with some embodiments. FIGS. 10 and 11 are illustrated along reference cross-section B-B in FIGS. 2C and 2D. In this embodiment, the integrated circuit package 100 is directly mounted to a package substrate.

In FIG. 10, conductive connectors 114 are formed physically and electrically connected to the redistribution structure 102. The conductive connectors 114 can be formed before or after the integrated circuit package 100 is singulated. The top dielectric layer of the redistribution structure 102 may be patterned to expose portions of the underlying metallization patterns. In some embodiments, under bump metallurgies (UBMs) may be formed in the openings. The conductive connectors 114 are formed on the UBMs. The conductive connectors 114 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 114 may be formed of a metal or metal alloy, such as solder, copper, aluminum, gold, nickel, silver, palladium, tin, the like, or a combination thereof. In some embodiments, the conductive connectors 114 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 114 are metal pillars (such as a copper pillar) formed by a sputtering, printing, electro plating, electroless plating, CVD, or the like. The metal pillars may be solder free and have substantially vertical sidewalls. The conductive connectors 114 are electrically coupled to the metallization patterns of the redistribution structure 102.

In FIG. 11, the integrated circuit package 100 is flipped and connected to a package substrate 200 using the conductive connectors 114. The package substrate 200 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 200 may be a SOI substrate. Generally, an SOI substrate includes a layer of a semiconductor material such as epitaxial silicon, germanium, silicon germanium, SOI, SGOI, or combinations thereof. The package substrate 200 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for package substrate 200.

The package substrate 200 may include active and passive devices (not illustrated). Devices such as transistors, capacitors, resistors, combinations of these, and the like may be used to generate the structural and functional requirements of the design for the system. The devices may be formed using any suitable methods.

The package substrate 200 may also include metallization layers and vias (not illustrated) and bond pads 202 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 200 is substantially free of active and passive devices.

The conductive connectors 114 are reflowed to attach the UBMs of the redistribution structure 102 to the bond pads 202. The conductive connectors 114 electrically and/or physically connect the package substrate 200, including metallization layers in the package substrate 200, to the integrated circuit package 100. In some embodiments, passive devices (e.g., surface mount devices (SMDs), not illustrated) may be attached to the integrated circuit package 100 (e.g., bonded to the bond pads 202) prior to mounting on the package substrate 200. In such embodiments, the passive devices may be bonded to a same surface of the integrated circuit package 100 as the conductive connectors 114. In some embodiments, passive devices (e.g., SMDs, not illustrated) may be attached to the package substrate 200, e.g., to the bond pads 202.

The conductive connectors 114 may have an epoxy flux (not illustrated) formed thereon before they are reflowed with at least some of the epoxy portion of the epoxy flux remaining after the integrated circuit package 100 is attached to the package substrate 200. This remaining epoxy portion may act as an underfill to reduce stress and protect the joints resulting from the reflowing the conductive connectors 114. In some embodiments, an underfill (not illustrated) may be formed between the integrated circuit package 100 and the package substrate 200, surrounding the conductive connectors 114. The underfill may be formed by a capillary flow process after the integrated circuit package 100 is attached or may be formed by a suitable deposition method before the integrated circuit package 100 is attached.

FIGS. 12 through 16 are cross-sectional views of intermediate steps during a process for forming a system implementing the integrated circuit package 100, in accordance with some other embodiments. FIGS. 12 through 16 are illustrated along reference cross-section B-B in FIGS. 2C and 2D. In this embodiment, the integrated circuit package 100 is singulated and included in a package component. Packaging of devices in one package region 302A is illustrated, but it should be appreciated that any number of package regions may be simultaneously formed. The package region 302A will be singulated in subsequent processing. The singulated package component may be a fan-out package, such as an integrated fan-out (InFO) package. The fan-out package is then mounted to a package substrate.

Figure 12:
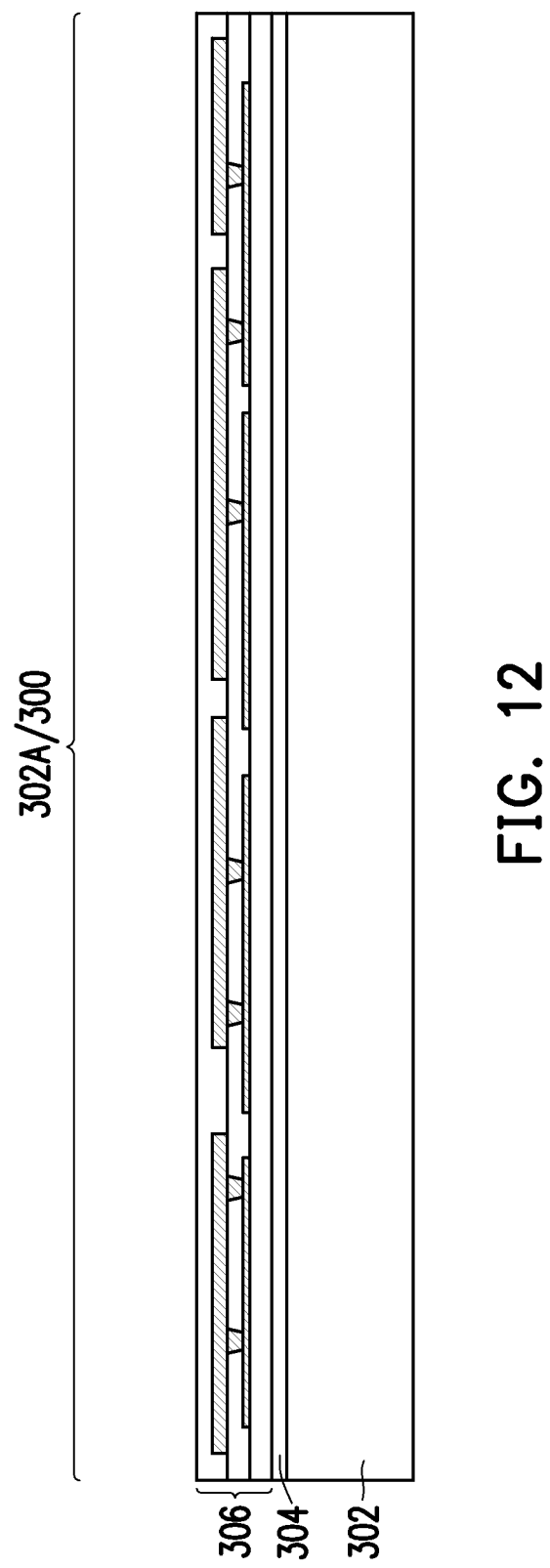
FIGS. 12, 13, 14, 15, and 16 are cross-sectional views of intermediate steps during a process for forming a system implementing an integrated circuit package, in accordance with some embodiments.

In FIG. 12, a carrier substrate 302 is provided, and a release layer 304 is formed on the carrier substrate 302. The carrier substrate 302 may be a glass carrier substrate, a ceramic carrier substrate, or the like. The carrier substrate 302 may be a wafer, such that multiple packages can be formed on the carrier substrate 302 simultaneously. The release layer 304 may be formed of a polymer-based material, which may be removed along with the carrier substrate 302 from the overlying structures that will be formed in subsequent steps. In some embodiments, the release layer 304 is an epoxy-based thermal-release material, which loses its adhesive property when heated, such as a light-to-heat-conversion (LTHC) release coating. In other embodiments, the release layer 304 may be an ultra-violet (UV) glue, which loses its adhesive property when exposed to UV lights. The release layer 304 may be dispensed as a liquid and cured, may be a laminate film laminated onto the carrier substrate 302, or may be the like. The top surface of the release layer 304 may be leveled and may have a high degree of planarity.

A redistribution structure 306 may be formed on the release layer 304. The redistribution structure 306 can be formed in a similar manner and of similar materials as the redistribution structure 102 described with respect to FIGS. 7A and 7B. The redistribution structure 306 includes dielectric layers and metallization patterns (sometimes referred to as redistribution layers or redistribution lines). More or fewer dielectric layers and metallization patterns than illustrated may be formed in the redistribution structure 306. The redistribution structure 306 is optional. In some embodiments, a dielectric layer without metallization patterns is formed on the release layer 304 in lieu of the redistribution structure 306.

Figure 13:
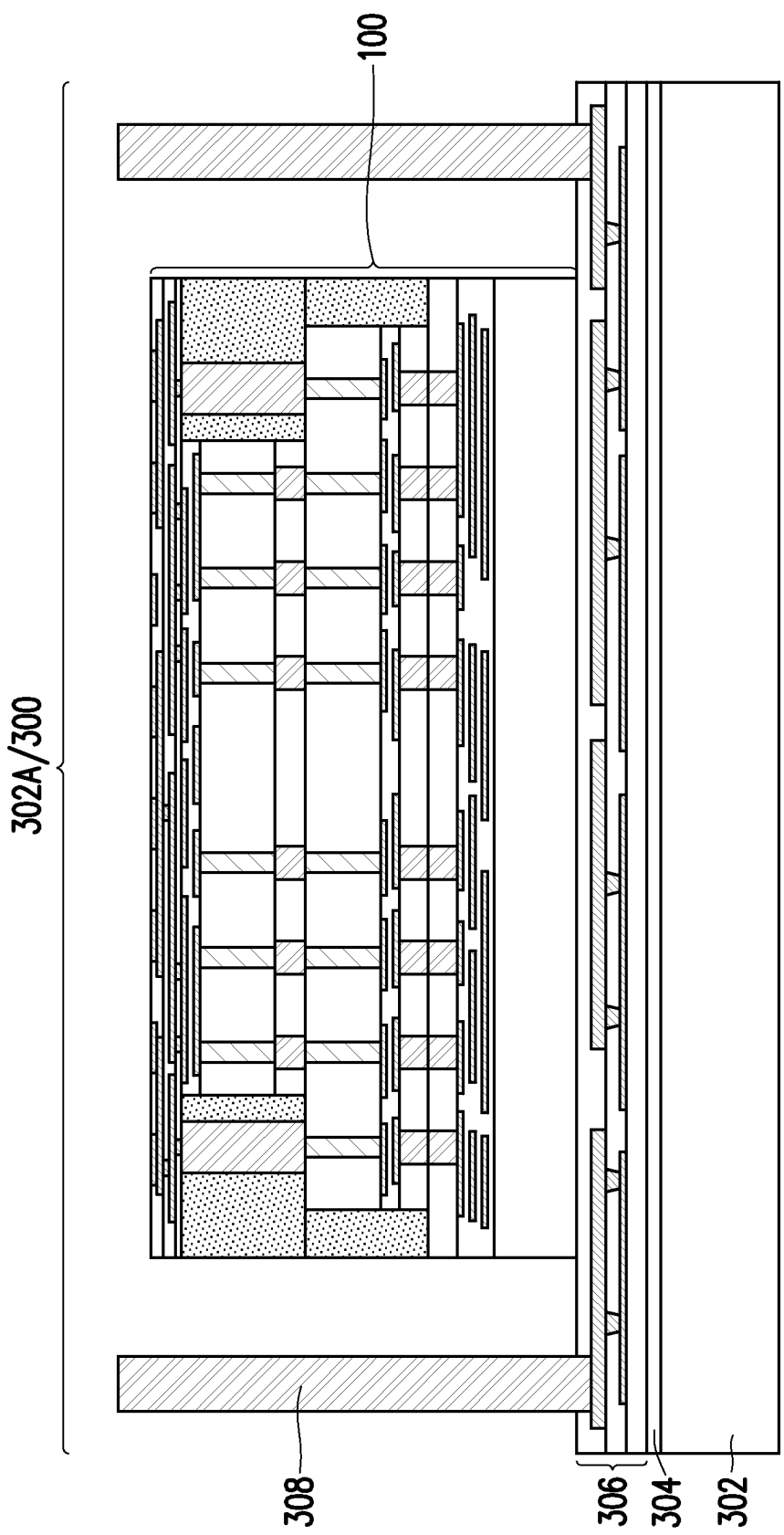

In FIG. 13, conductive vias 308 are formed extending through the topmost dielectric layer of the redistribution structure 306. Thus, the conductive vias 308 are connected to the metallization patterns of the redistribution structure 306. The conductive vias 308 are optional, and may be omitted. For example, the conductive vias 308 may (or may not) be omitted in embodiments where the redistribution structure 306 is omitted.

As an example to form the conductive vias 308, openings can be formed in the topmost dielectric layer of the redistribution structure 306. A seed layer is then formed over the redistribution structure 306, e.g., on the topmost dielectric layer of the redistribution structure 306 and portions of the metallization pattern of the redistribution structure 306 exposed by the openings. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive vias 308.

A singulated integrated circuit package 100 is placed on the redistribution structure 306. In the illustrated embodiment, a structure similar to that described with respect to FIGS. 8A and 8B is obtained. In another embodiment, a structure similar to that described with respect to FIGS. 9A and 9B is obtained. As noted above, in the integrated circuit package 100, the devices are bonded to one another without the use of solder. The singulated integrated circuit package 100 is thus free from solder.

Figure 14:
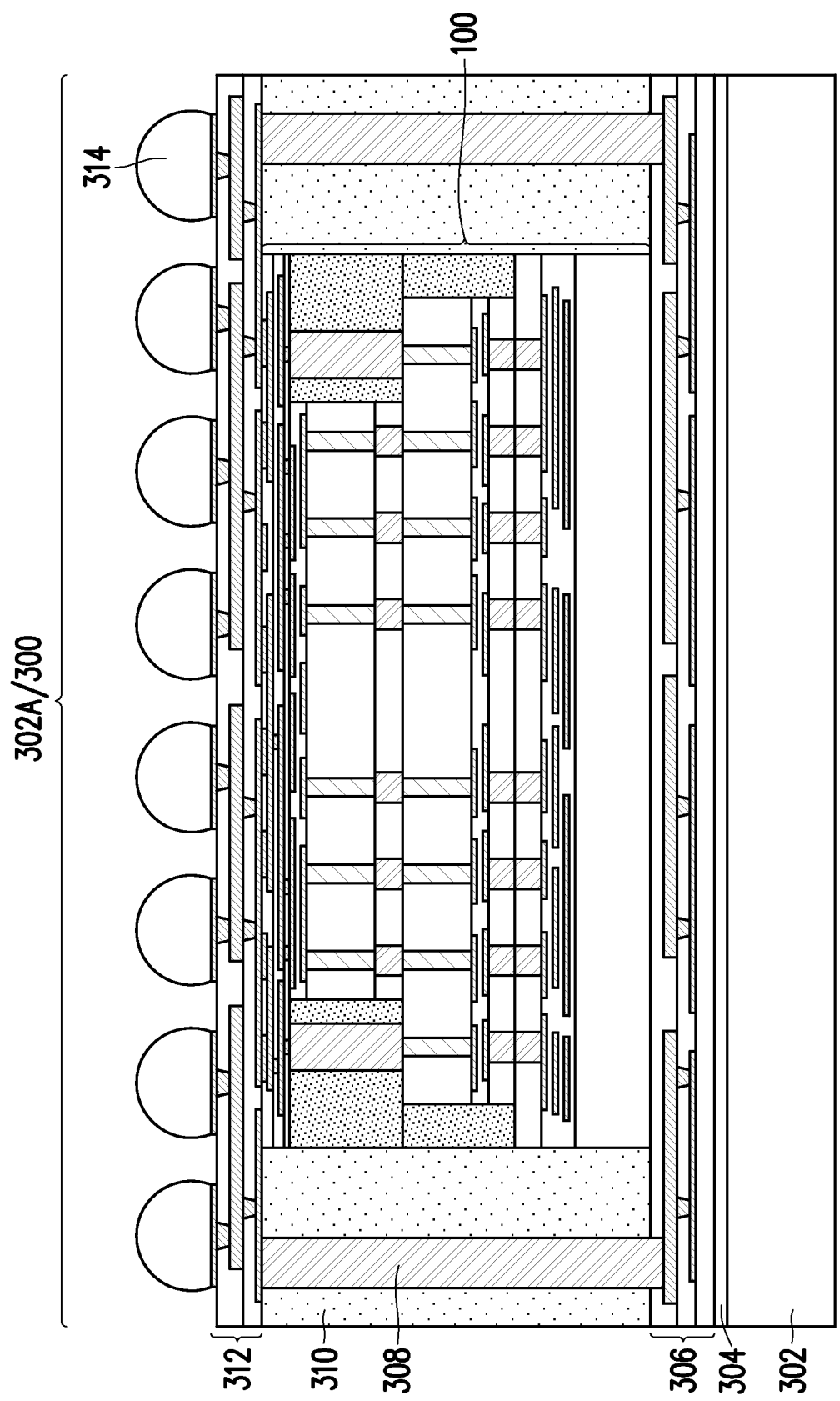

In FIG. 14, an encapsulant 310 is formed around the integrated circuit package 100. The encapsulant 310 laterally surrounds the integrated circuit package 100. The encapsulant 310 may be a molding compound, epoxy, or the like. The encapsulant 310 may be applied by compression molding, transfer molding, or the like, and may be applied in liquid or semi-liquid form and then subsequently cured.

In some embodiments, the encapsulant 310 is formed over the integrated circuit package 100 such that the redistribution structure 102 is buried or covered. A planarization process may be performed on the encapsulant 310 to expose the integrated circuit package 100. The planarization process can remove material of the encapsulant 310 until the redistribution structure 102 is exposed. Top surfaces of the encapsulant 310 and redistribution structure 102 are coplanar after the planarization process. The planarization process may be, for example, a CMP process, a grinding process, an etch back process, the like, or combinations thereof. In other embodiments, the encapsulant 310 is not formed over the integrated circuit package 100, and no planarization process is necessary to expose the integrated circuit package 100.

A redistribution structure 312 is then formed on the encapsulant 310 and the redistribution structure 102. The redistribution structure 312 can be formed in a similar manner and of similar materials as the redistribution structure 102 described with respect to FIGS. 7A and 7B. The redistribution structure 312 includes dielectric layers and metallization patterns (sometimes referred to as redistribution layers or redistribution lines). More or fewer dielectric layers and metallization patterns than illustrated may be formed in the redistribution structure 306. A bottom dielectric layer of the redistribution structure 312 physically contacts the encapsulant 310 and a top dielectric layer of the redistribution structure 102. The metallization patterns of the redistribution structure 312 are electrically coupled to the metallization patterns of the redistribution structure 102.

Conductive connectors 314 are formed physically and electrically connected to the metallization patterns of the redistribution structure 312. The conductive connectors 314 can be formed in a similar manner and of similar materials as the conductive connectors 114 described with respect to FIG. 10.

Figure 15:
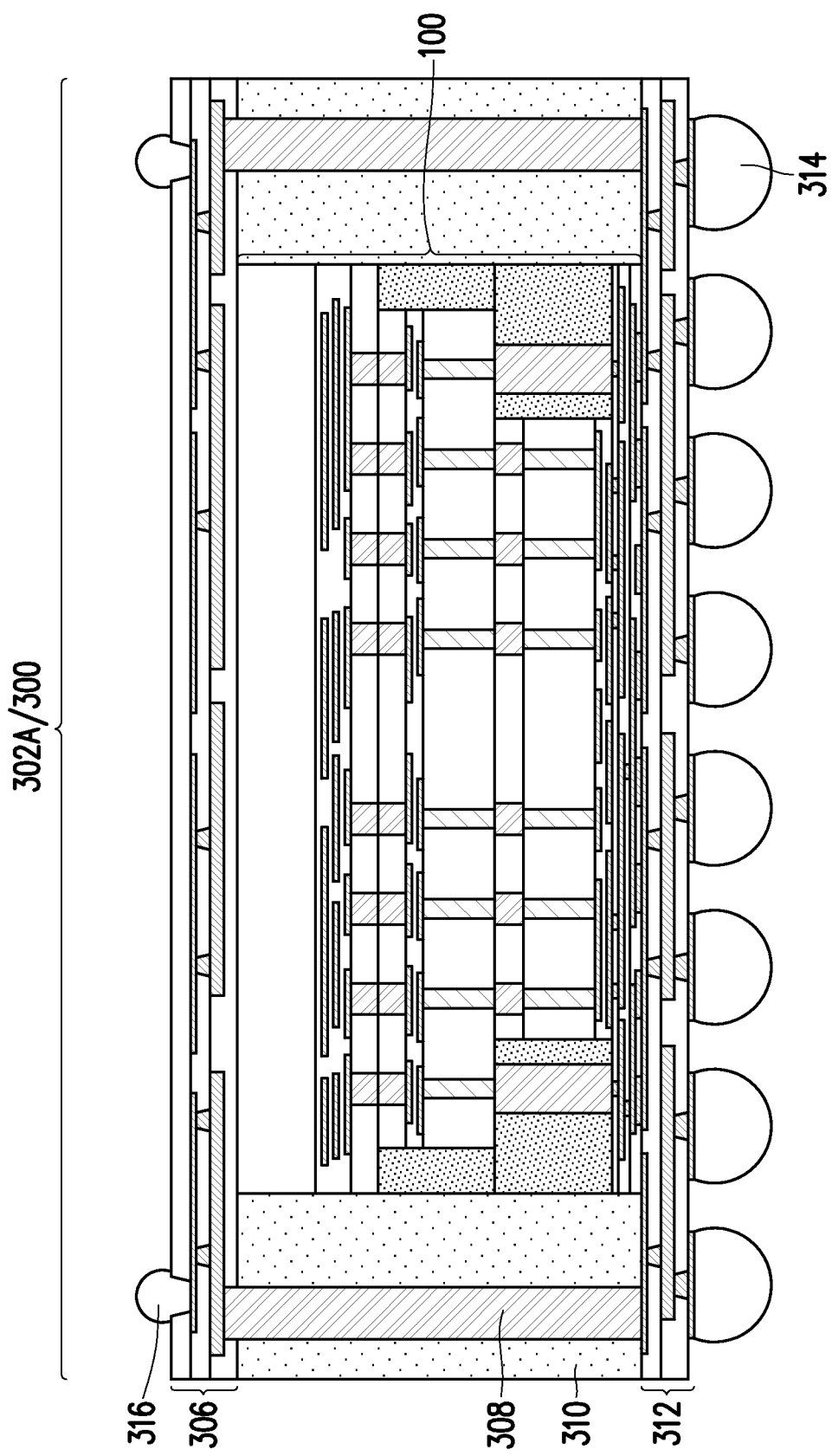

In FIG. 15, a carrier substrate debonding is performed to detach (de-bond) the carrier substrate 302 from the redistribution structure 306, e.g., the bottommost dielectric layer of the redistribution structure 306. In accordance with some embodiments, the de-bonding includes projecting a light such as a laser light or an UV light on the release layer 304 so that the release layer 304 decomposes under the heat of the light and the carrier substrate 302 can be removed. The structure can then be flipped over and placed on, e.g., a tape.

Further, conductive connectors 316 are formed through the bottommost dielectric layer of the redistribution structure 306. Openings can be formed through the bottommost dielectric layer of the redistribution structure 306, exposing portions of the metallization patterns of the redistribution structure 306. The openings may be formed, for example, using laser drilling, etching, or the like. The conductive connectors 316 are formed in the openings, and are connected to exposed portions of the metallization patterns of the redistribution structure 306. The conductive connectors 316 can be formed in a similar manner and of similar materials as the conductive connectors 114 described with respect to FIG. 10.

Figure 16:
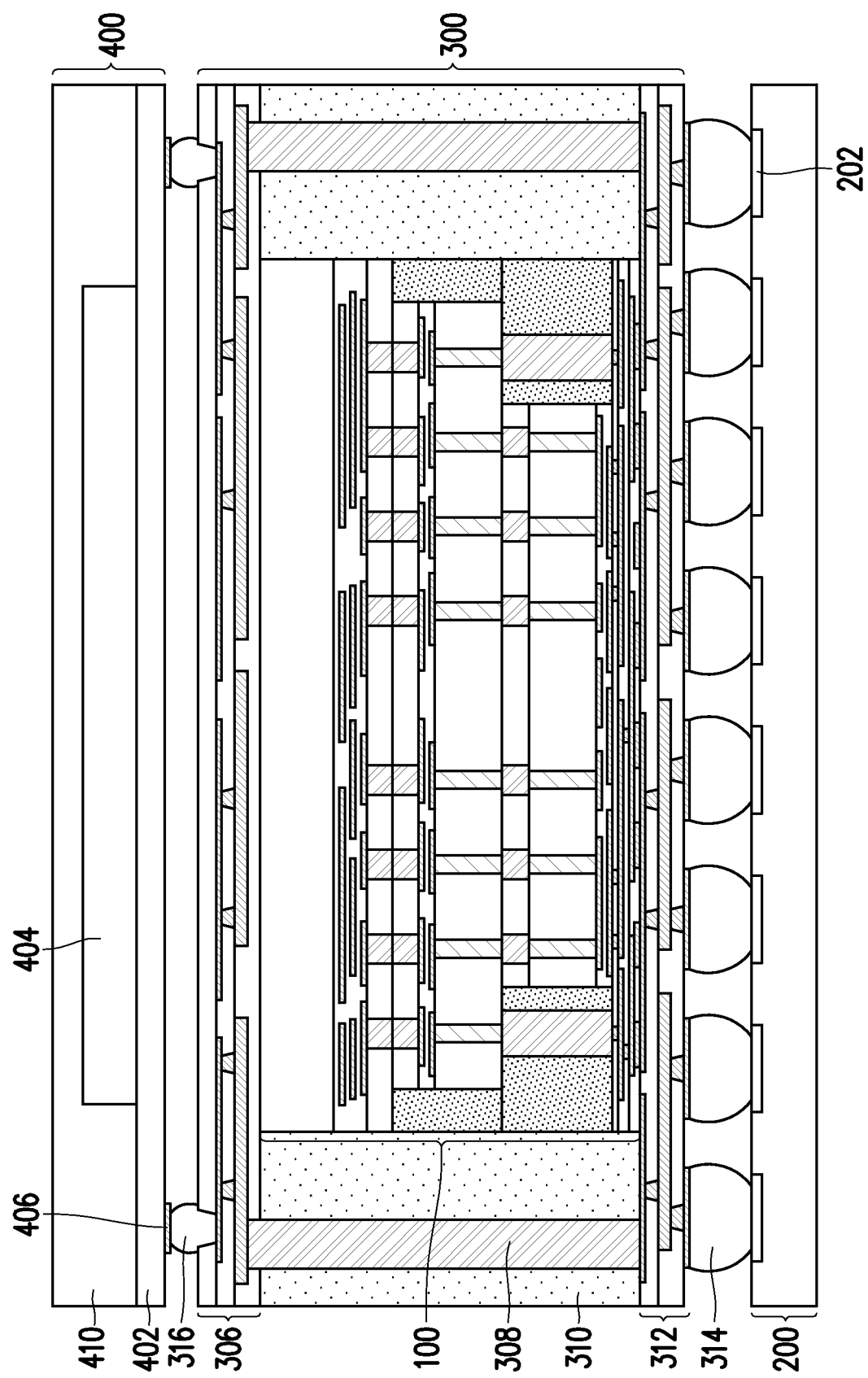

In FIG. 16, a singulation process is performed by sawing along scribe line regions, e.g., around the package region 302A. The singulation process includes sawing the redistribution structures 306, 312 and encapsulant 310. The singulation process separates the package region 302A from adjacent package regions (not illustrated) to form an integrated circuit package 300. After singulation, the redistribution structures 306, 312 and the encapsulant 310 are laterally coterminous.

Another integrated circuit package 400 can be attached to the integrated circuit package 300 to form a package-on-package structure. The integrated circuit package 400 may be a memory package. The integrated circuit package 400 can be attached to the integrated circuit package 300 before or after the integrated circuit package 300 is singulated. The integrated circuit package 400 includes a substrate 402 and one or more dies 404 connected to the substrate 402. In some embodiments (not shown) one or more stacks of dies 404 are connected to the substrate 402. The substrate 402 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 402 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 402 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 402.

The substrate 402 may include active and passive devices (not shown). As one of ordinary skill in the art will recognize, a wide variety of devices such as transistors, capacitors, resistors, combinations of these, and the like may be used to generate the structural and functional requirements of the design for the integrated circuit package 400. The devices may be formed using any suitable methods. The substrate 402 may also include metallization layers (not shown) and through vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 402 is substantially free of active and passive devices.

The substrate 402 may have bond pads 406 on a side of the substrate 402, to connect to the conductive connectors 316. In some embodiments, the bond pads 406 are formed by forming recesses (not shown) into dielectric layers (not shown) on the side of the substrate 402. The recesses may be formed to allow the bond pads 406 to be embedded into the dielectric layers. In other embodiments, the recesses are omitted as the bond pads 406 may be formed on the dielectric layer. In some embodiments, the bond pads 406 include a thin seed layer (not shown) made of copper, titanium, nickel, gold, palladium, the like, or a combination thereof. The conductive material of the bond pads 406 may be deposited over the thin seed layer. The conductive material may be formed by an electro-chemical plating process, an electroless plating process, CVD, ALD, PVD, the like, or a combination thereof. In an embodiment, the conductive material of the bond pads 406 is copper, tungsten, aluminum, silver, gold, the like, or a combination thereof.

In an embodiment, the bond pads 406 are UBMs that include three layers of conductive materials, such as a layer of titanium, a layer of copper, and a layer of nickel. For example, the bond pads 406 may be formed from copper, may be formed on a layer of titanium (not shown), and have a nickel finish, which may improve the shelf life of the integrated circuit package 400, which may be particularly advantageous when the integrated circuit package 400 is a memory device such as a DRAM module. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the bond pads 406. Any suitable materials or layers of material that may be used for the bond pads 406 are fully intended to be included within the scope of the current application.

In the illustrated embodiment, the dies 404 are connected to the substrate 402 by conductive bumps, although other connections may be used, such as wire bonds. In an embodiment, the dies 404 are stacked memory dies. For example, the dies 404 may be memory dies such as low-power (LP) double data rate (DDR) memory modules, such as LPDDR1, LPDDR2, LPDDR3, LPDDR4, or the like.

The dies 404 and the wire bonds (when present) may be encapsulated by a molding material 410. The molding material 410 may be molded on the dies 404 and the wire bonds, for example, using compression molding. In some embodiments, the molding material 410 is a molding compound, a polymer, an epoxy, silicon oxide filler material, the like, or a combination thereof. A curing process may be performed to cure the molding material 410; the curing process may be a thermal curing, a UV curing, the like, or a combination thereof. In some embodiments, the dies 404 are buried in the molding material 410, and after the curing of the molding material 410, a planarization step, such as a grinding, is performed to remove excess portions of the molding material 410 and provide a substantially planar surface for the integrated circuit package 400.

After the integrated circuit package 400 is formed, the integrated circuit package 400 is attached to the integrated circuit package 300 by way of the conductive connectors 316. The conductive connectors 316 can be connected to the bond pads 406 by reflowing the conductive connectors 316. The dies 404 may thus be electrically coupled to the integrated circuit package 100 through the conductive connectors 316, the conductive vias 308, and the redistribution structures 306, 312.

In some embodiments, a solder resist (not shown) is formed on the side of the substrate 402 opposing the dies 404. The conductive connectors 316 may be disposed in openings in the solder resist to be connected to conductive features (e.g., the bond pads 406) in the substrate 402. The solder resist may be used to protect areas of the substrate 402 from external damage.

In some embodiments, the conductive connectors 316 have an epoxy flux (not shown) formed thereon before they are reflowed with at least some of the epoxy portion of the epoxy flux remaining after the integrated circuit package 400 is attached to the redistribution structure 306.

In some embodiments, an underfill (not shown) is formed between the redistribution structure 306 and the substrate 402, and surrounding the conductive connectors 316. The underfill may reduce stress and protect the joints resulting from the reflowing of the conductive connectors 316. The underfill may be formed by a capillary flow process after the integrated circuit package 400 is attached or may be formed by a suitable deposition method before the integrated circuit package 400 is attached. In embodiments where the epoxy flux is formed, it may act as the underfill.

The package-on-package structure is then flipped and attached to a package substrate 200 using the conductive connectors 314. The package substrate 200 may be similar to the package substrate 200 described with respect to FIG. 11. For example, the package substrate 200 can include bond pads 202, which are connected to the conductive connectors 314.

Figure 17:
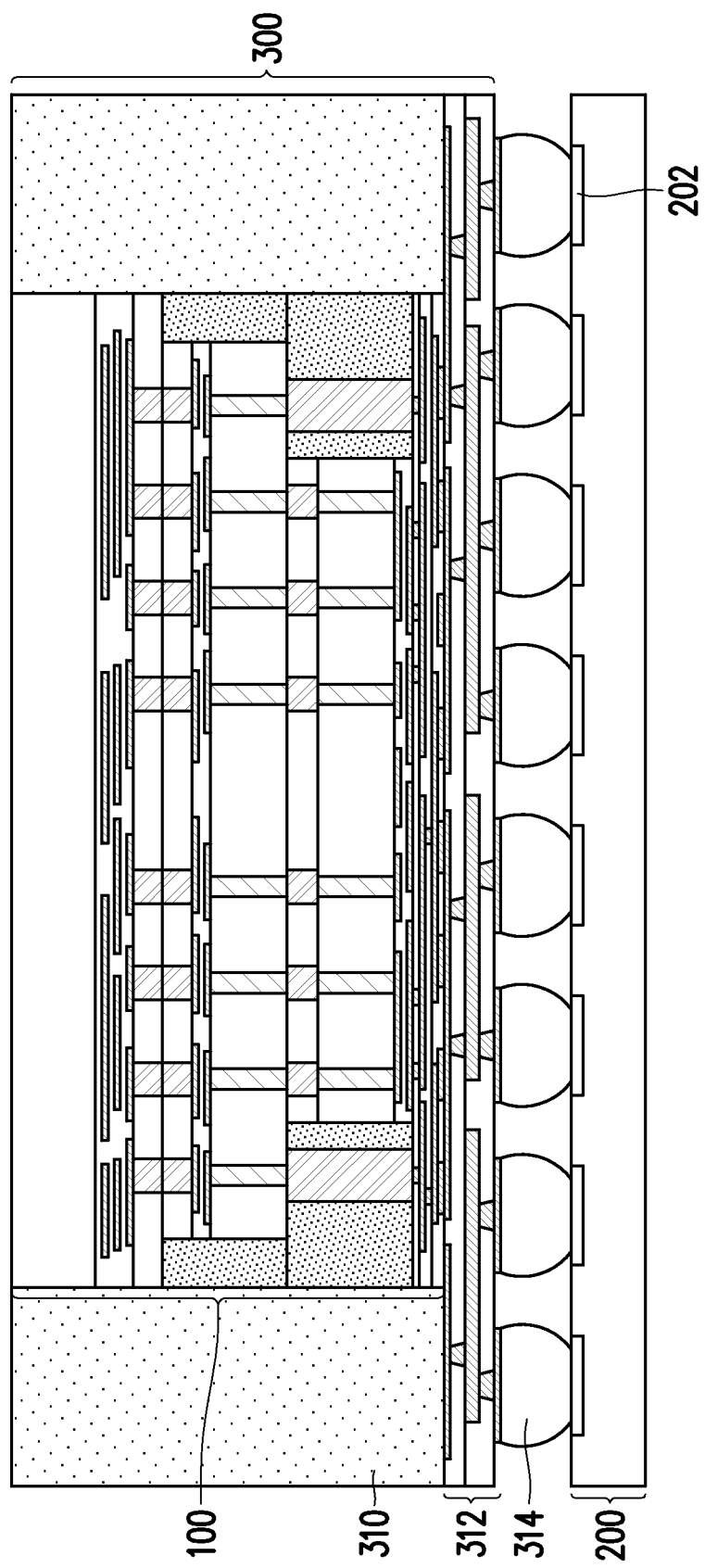
FIG. 17 is a cross-sectional view of system implementing an integrated circuit package, in accordance with some embodiments.

FIG. 17 is a cross-sectional view of a system implementing the integrated circuit package 100, in accordance with some other embodiments. FIG. 17 is illustrated along reference cross-section B-B in FIGS. 2C and 2D. In this embodiment, an integrated circuit package 300 similar to FIG. 16 is formed, but the redistribution structure 306, the conductive vias 308, the conductive connectors 316, and the integrated circuit package 400 are omitted.

Embodiments may achieve advantages. Interconnecting the dies by hybrid bonding allows the quantity of data signal lines in the redistribution structures of the integrated circuit packages to be reduced. Power delivery and routing can also be simplified by the use of passive devices integrated into the integrated circuit packages. Using a separate memory device instead of including memories with the processor devices of the integrated circuit package may allow the overall amount of memory in the integrated circuit package to be increased without substantially increasing manufacturing costs of the processor devices. Further, forming the processor devices of the integrated circuit package without memories allows more processing units (e.g., cores) to be included in the processor devices without substantially increasing the footprint of the processor devices. The footprint and manufacturing costs of the integrated circuit package may thus be reduced.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an embodiment, a structure includes: a first processor device having a front side; a shared memory device having a front side and a back side opposite the front side, the front side of the shared memory device bonded to the front side of the first processor device by metal-to-metal bonds and by dielectric-to-dielectric bonds; a first dielectric layer laterally surrounding the shared memory device; first conductive vias extending through the first dielectric layer; a second processor device having a front side and a back side opposite the front side, the first conductive vias connecting the front side of the first processor device to the back side of the second processor device, the back side of the second processor device bonded to the first conductive vias and the back side of the shared memory device by metal-to-metal bonds, the back side of the second processor device bonded to the first dielectric layer by dielectric-to-dielectric bonds, the first processor device and the second processor device each being different types of processor devices; and a first redistribution structure connected to the front side of the second processor device.

In some embodiments, the structure further includes: a second dielectric layer laterally surrounding the second processor device; second conductive vias extending through the second dielectric layer, the second conductive vias connecting the first redistribution structure to the back side of the shared memory device; and third conductive vias extending through the first dielectric layer and the second dielectric layer, the third conductive vias connecting the first redistribution structure to the front side of the first processor device. In some embodiments, the first redistribution structure includes a power supply source line and a power supply ground line, the second conductive vias and the third conductive vias each electrically coupled to the power supply source line and the power supply ground line. In some embodiments, the shared memory device includes through substrate vias (TSVs), the second processor device electrically coupled to the first processor device by the TSVs and the first conductive vias. In some embodiments, the structure further includes: a passive device having a front side and a back side opposite the front side, the front side of the passive device bonded to the front side of the first processor device by metal-to-metal bonds and by dielectric-to-dielectric bonds; a second dielectric layer laterally surrounding the second processor device; and second conductive vias extending through the second dielectric layer, the second conductive vias connecting the first redistribution structure to the back side of the passive device. In some embodiments, the first processor device is a graphics processing unit (GPU), the second processor device is a central processing unit (CPU), and the passive device is a power management integrated circuit (PMIC) for the GPU. In some embodiments, the structure further includes: an encapsulant laterally surrounding the shared memory device, the first processor device, the second processor device, and the first redistribution structure; and a second redistribution structure contacting the encapsulant, the second redistribution structure connected to the first redistribution structure. In some embodiments, the structure further includes: a package substrate, and conductive connectors connecting the package substrate to the second redistribution structure. In some embodiments, the structure further includes: a package substrate, and conductive connectors connecting the package substrate to the first redistribution structure. In some embodiments, the first processor device and the second processor device have active devices of a smaller technology node than the shared memory device.

In an embodiment, a structure includes: a graphics processor device; a passive device coupled to the graphics processor device, the passive device being directly face-to-face bonded to the graphics processor device; a shared memory device coupled to the graphics processor device, the shared memory device being directly face-to-face bonded to the graphics processor device; a central processor device coupled to the shared memory device, the central processor device being directly back-to-back bonded to the shared memory device, the central processor device and the graphics processor device each having active devices of a smaller technology node than the shared memory device; and a redistribution structure coupled to the central processor device, the shared memory device, the passive device, and the graphics processor device.

In some embodiments, the shared memory device is narrower than the central processor device in a first plane, and the shared memory device is wider than the central processor device in a second plane, the first plane being perpendicular to the second plane. In some embodiments, the graphics processor device is wider than the central processor device and the shared memory device in the first plane and the second plane.

In an embodiment, a method includes: bonding a shared memory device to a first processor device; forming a first dielectric layer around the shared memory device; forming first conductive vias extending through the first dielectric layer, the first conductive vias connected to the first processor device; bonding a second processor device to the first conductive vias, the first dielectric layer, and the shared memory device, the first processor device and the second processor device each being different types of processor devices; forming a second dielectric layer around the second processor device; forming second conductive vias extending through the second dielectric layer, the second conductive vias connected to the shared memory device; forming third conductive vias extending through the first dielectric layer and the second dielectric layer, the third conductive vias connected to the first processor device; and forming a redistribution structure on the second conductive vias, the third conductive vias, the second dielectric layer, and the second processor device.

In some embodiments, the method further includes: obtaining a wafer including the first processor device, where bonding the shared memory device to the first processor device includes bonding the shared memory device to the wafer; and after forming the redistribution structure, sawing the wafer, the first dielectric layer, the second dielectric layer, and the redistribution structure. In some embodiments, the method further includes, before bonding the shared memory device to the first processor device: obtaining a wafer including the first processor device; sawing the wafer to singulate the first processor device; and encapsulating the first processor device. In some embodiments, forming the first conductive vias includes: patterning first openings in the first dielectric layer, the first openings exposing die connectors of the first processor device; plating a conductive material in the first openings; and planarizing the conductive material and the first dielectric layer, remaining portions of the conductive material in the first openings forming the first conductive vias. In some embodiments, forming the second conductive vias includes: patterning second openings in the second dielectric layer, the second openings exposing die connectors of the shared memory device; plating the conductive material in the second openings; and planarizing the conductive material and the second dielectric layer, remaining portions of the conductive material in the second openings forming the second conductive vias. In some embodiments, forming the first dielectric layer includes forming the first dielectric layer around the passive device, and where a subset of the second conductive vias are connected to the passive device. In some embodiments, the first processor device is a graphics processing unit (GPU), the second processor device is a central processing unit (CPU), and the passive device is a power management integrated circuit (PMIC) for the GPU.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a first processor device having a front side;
a shared memory device having a front side and a back side opposite the front side, the front side of the shared memory device bonded to the front side of the first processor device by metal-to-metal bonds and by dielectric-to-dielectric bonds;
a first dielectric layer laterally surrounding the shared memory device;
first conductive vias extending through the first dielectric layer;
a second processor device having a front side and a back side opposite the front side, the first conductive vias connecting the front side of the first processor device to the back side of the second processor device, the back side of the second processor device bonded to the first conductive vias and the back side of the shared memory device by metal-to-metal bonds, the back side of the second processor device bonded to the first dielectric layer by dielectric-to-dielectric bonds, the first processor device and the second processor device each being different types of processor devices; and
a first redistribution structure connected to the front side of the second processor device.

2. The structure of claim 1 further comprising:
a second dielectric layer laterally surrounding the second processor device;
second conductive vias extending through the second dielectric layer, the second conductive vias connecting the first redistribution structure to the back side of the shared memory device; and
third conductive vias extending through the first dielectric layer and the second dielectric layer, the third conductive vias connecting the first redistribution structure to the front side of the first processor device.

3. The structure of claim 2, wherein the first redistribution structure comprises a power supply source line and a power supply ground line, the second conductive vias and the third conductive vias each electrically coupled to the power supply source line and the power supply ground line.

4. The structure of claim 1, wherein the shared memory device comprises through substrate vias (TSVs), the second processor device electrically coupled to the first processor device by the TSVs and the first conductive vias.

5. The structure of claim 1 further comprising:
a passive device having a front side and a back side opposite the front side, the front side of the passive device bonded to the front side of the first processor device by metal-to-metal bonds and by dielectric-to-dielectric bonds;
a second dielectric layer laterally surrounding the second processor device; and
second conductive vias extending through the second dielectric layer, the second conductive vias connecting the first redistribution structure to the back side of the passive device.

6. The structure of claim 5, wherein the first processor device is a graphics processing unit (GPU), the second processor device is a central processing unit (CPU), and the passive device is a power management integrated circuit (PMIC) for the GPU.

7. The structure of claim 1 further comprising:
an encapsulant laterally surrounding the shared memory device, the first processor device, the second processor device, and the first redistribution structure; and
a second redistribution structure contacting the encapsulant, the second redistribution structure connected to the first redistribution structure.

8. The structure of claim 7 further comprising:
a package substrate; and
conductive connectors connecting the package substrate to the second redistribution structure.

9. The structure of claim 1 further comprising:
a package substrate; and
conductive connectors connecting the package substrate to the first redistribution structure.

10. The structure of claim 1, wherein the first processor device and the second processor device have active devices of a smaller technology node than the shared memory device.

11. A structure comprising:
a graphics processor device;
a passive device coupled to the graphics processor device, the passive device being directly face-to-face bonded to the graphics processor device;
a shared memory device coupled to the graphics processor device, the shared memory device being directly face-to-face bonded to the graphics processor device;
a central processor device coupled to the shared memory device, the central processor device being directly back-to-back bonded to the shared memory device, the central processor device and the graphics processor device each having active devices of a smaller technology node than the shared memory device; and
a redistribution structure coupled to the central processor device, the shared memory device, the passive device, and the graphics processor device.

12. The structure of claim 11, wherein the shared memory device is narrower than the central processor device in a first plane, and the shared memory device is wider than the central processor device in a second plane, the first plane being perpendicular to the second plane.

13. The structure of claim 12, wherein the graphics processor device is wider than the central processor device and the shared memory device in the first plane and the second plane.

14. A method comprising:
bonding a shared memory device to a first processor device;
forming a first dielectric layer around the shared memory device;
forming first conductive vias extending through the first dielectric layer, the first conductive vias connected to the first processor device;
bonding a second processor device to the first conductive vias, the first dielectric layer, and the shared memory device, the first processor device and the second processor device each being different types of processor devices;
forming a second dielectric layer around the second processor device;
forming second conductive vias extending through the second dielectric layer, the second conductive vias connected to the shared memory device;
forming third conductive vias extending through the first dielectric layer and the second dielectric layer, the third conductive vias connected to the first processor device; and
forming a redistribution structure on the second conductive vias, the third conductive vias, the second dielectric layer, and the second processor device.

15. The method of claim 14 further comprising:
obtaining a wafer comprising the first processor device, wherein bonding the shared memory device to the first processor device comprises bonding the shared memory device to the wafer; and
after forming the redistribution structure, sawing the wafer, the first dielectric layer, the second dielectric layer, and the redistribution structure.

16. The method of claim 14 further comprising, before bonding the shared memory device to the first processor device:
obtaining a wafer comprising the first processor device;
sawing the wafer to singulate the first processor device; and
encapsulating the first processor device.

17. The method of claim 14, wherein forming the first conductive vias comprises:
patterning first openings in the first dielectric layer, the first openings exposing die connectors of the first processor device;
plating a conductive material in the first openings; and
planarizing the conductive material and the first dielectric layer, remaining portions of the conductive material in the first openings forming the first conductive vias.

18. The method of claim 17, wherein forming the second conductive vias comprises:
patterning second openings in the second dielectric layer, the second openings exposing through substrate vias of the shared memory device;
plating the conductive material in the second openings; and
planarizing the conductive material and the second dielectric layer, remaining portions of the conductive material in the second openings forming the second conductive vias.

19. The method of claim 14 further comprising:
bonding a passive device to the first processor device, wherein forming the first dielectric layer comprises forming the first dielectric layer around the passive device, and wherein a subset of the second conductive vias are connected to the passive device.

20. The method of claim 19, wherein the first processor device is a graphics processing unit (GPU), the second processor device is a central processing unit (CPU), and the passive device is a power management integrated circuit (PMIC) for the GPU.

* * * * *